US006426779B1

(12) United States Patent
Noguchi et al.

(10) Patent No.: US 6,426,779 B1
(45) Date of Patent: Jul. 30, 2002

(54) METHOD AND APPARATUS FOR PROVIDING FAVORITE STATION AND PROGRAMMING INFORMATION IN A MULTIPLE STATION BROADCAST SYSTEM

(75) Inventors: Fujio Noguchi, Ridgewood, NJ (US); Kazuhiko Akaike, Tokyo (JP); Setsuko Watanabe Blaszkowski, San Diego, CA (US); Noriko Kotabe, Canton Cardiff (GB); Takashi Otani, Soka (JP); Tadashi Kajiwara, San Diego, CA (US)

(73) Assignee: Sony Electronics, Inc., Park Ridge, NJ (US)

( * ) Notice: Subject to any disclaimer, the term of this patent is extended or adjusted under 35 U.S.C. 154(b) by 0 days.

(21) Appl. No.: 08/369,676

(22) Filed: Jan. 4, 1995

(51) Int. Cl.[7] .................................................. H04N 5/50
(52) U.S. Cl. ........................ 348/569; 348/570; 348/906; 725/38; 725/39; 725/40
(58) Field of Search ................................ 348/6, 12, 13, 348/7, 569, 552, 570, 731, 734, 906; 455/185.1, 186.1, 168; 725/39, 38, 52, 40; H04N 5/44, 5/445, 5/50

(56) References Cited

U.S. PATENT DOCUMENTS

| | | | |
|---|---|---|---|
| 4,751,578 A | 6/1988 | Reiter et al. ................. 358/183 |
| 4,855,833 A | 8/1989 | Kageyama et al. ......... 358/183 |
| 5,040,067 A | 8/1991 | Yamazaki .................... 358/183 |
| 5,179,641 A | 1/1993 | Comins et al. ............. 395/132 |
| 5,223,924 A | 6/1993 | Strubbe ........................ 358/86 |
| 5,253,066 A | 10/1993 | Vogel .......................... 358/188 |
| 5,283,561 A | 2/1994 | Lumelsky et al. .......... 340/721 |
| 5,315,392 A | 5/1994 | Ishikawa et al. ............ 348/570 |
| 5,317,403 A | * 5/1994 | Keenan ....................... 348/731 |
| 5,323,234 A | 6/1994 | Kawasaki ....................... 348/6 |
| 5,353,121 A | * 10/1994 | Young et al. ............... 348/563 |
| 5,398,074 A | 3/1995 | Duffield ...................... 348/564 |
| 5,416,508 A | 5/1995 | Sakuma et al. ................. 348/3 |
| 5,436,676 A | * 7/1995 | Pint et al. .................... 348/734 |
| 5,465,113 A | * 11/1995 | Gilboy ......................... 348/5.5 |
| 5,502,504 A | 3/1996 | Marshall et al. |
| 5,512,955 A | 4/1996 | Toyoshima et al. ......... 348/569 |
| 5,523,796 A | * 6/1996 | Marshall et al. ............ 348/589 |
| 5,524,195 A | 6/1996 | Clanton, III et al. ....... 395/155 |
| 5,528,304 A | 6/1996 | Cherrick et al. ............ 348/565 |
| 5,532,753 A | 7/1996 | Buchner et al. ............ 348/569 |
| 5,532,754 A | * 7/1996 | Young et al. ............... 348/569 |
| 5,559,550 A | 9/1996 | Mankovitz ...................... 348/6 |
| 5,585,866 A | * 12/1996 | Miller et al. ................ 348/731 |
| 5,594,509 A | * 1/1997 | Florin et al. ................ 348/731 |
| 5,596,373 A | 1/1997 | White et al. |
| 5,621,456 A | * 4/1997 | Florin et al. .................... 348/7 |
| 5,671,411 A | 9/1997 | Watts et al. ................. 395/615 |
| 5,703,795 A | 12/1997 | Mankovitz .............. 364/514 R |
| 5,719,637 A | 2/1998 | Ohkura ........................ 348/564 |
| 5,731,844 A | 3/1998 | Rauch et al. ............... 348/563 |
| 5,737,029 A | 4/1998 | Ohkura ........................ 348/564 |
| 5,745,909 A | 4/1998 | Perlman et al. ............. 707/513 |
| 5,796,407 A | 8/1998 | Rebiai et al. ............... 345/430 |

FOREIGN PATENT DOCUMENTS

EP          0267020          11/1988

* cited by examiner

*Primary Examiner*—Michael Lee
(74) *Attorney, Agent, or Firm*—Blakely, Sokoloff, Taylor & Zafman LLP

(57) ABSTRACT

An innovative but easy line guide is provided to provide the user of a multiple channel television broadcast system a wealth of programming information in a simple format that is easy to understand. The guide enables the user to easily select a particular program to watch. In e particular, the system provides an innovative mechanism to enable the user to scan program information of channels that the user has designated as his favorite channels. A button is provided that is designated as "favorite". When the user is in a broadcast guide and selects the button, the system responds by displaying program information regarding the favorite stations at the top of the guide. Thus, the user sees at the top of the list the current programming with respect to his favorite stations, followed by program information for the remaining stations.

8 Claims, 33 Drawing Sheets

| | 12:30 PM | 1:00PM | 1:30PM | 2:00PM |
|---|---|---|---|---|
| OTV 149 | Seduce Me: Pamela Principle 2 | | | Seduce Me: Pamela Pr... |
| MTV 150 | Top Rap Videos | Music of the 70's | | |
| CTV 151 | Cooking with Linus | Comedy Club | | |
| OTV 154 | The Ref | | The Ref | |
| OTV 155 | Star Trek | | The Chase | |
| STV 156 | Wildlife Safari | | Ancient Civilizations | |

Movies Guide — Thurs 12/16/94 1:54PM

| Themes | Sports | Other | All | Exit |

Fig. 1
(PRIOR ART)

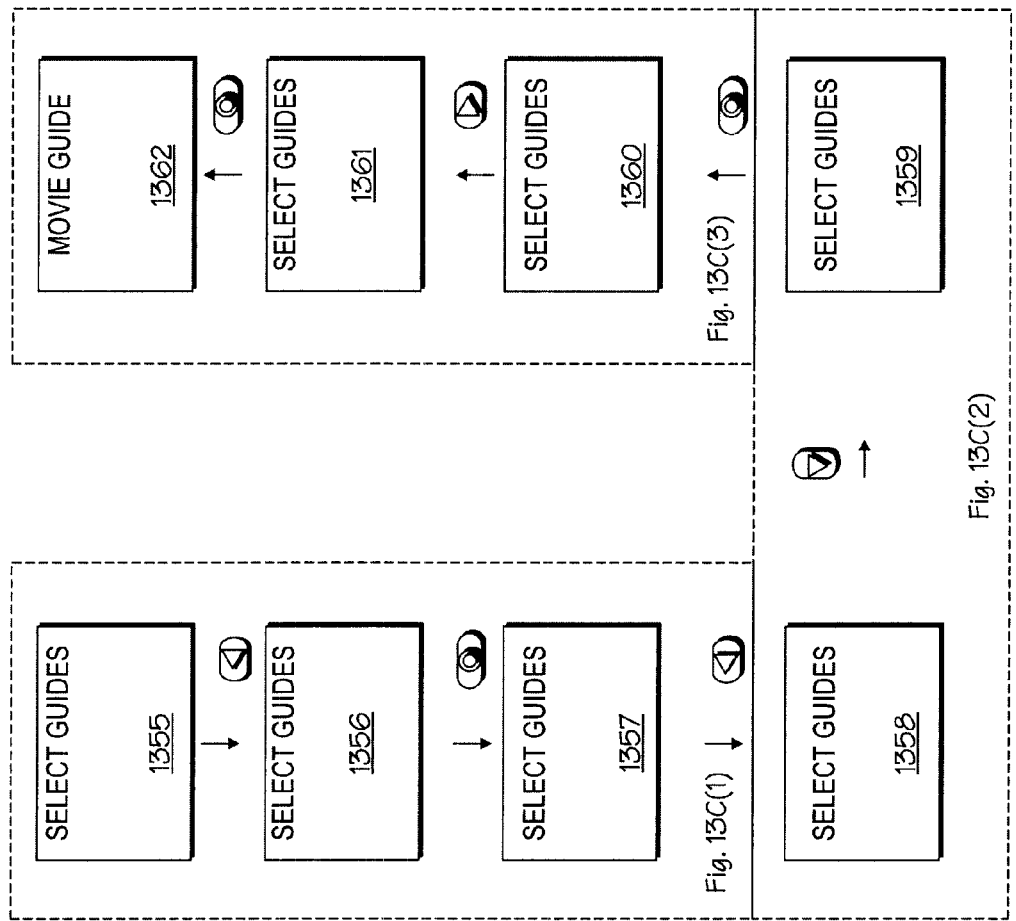

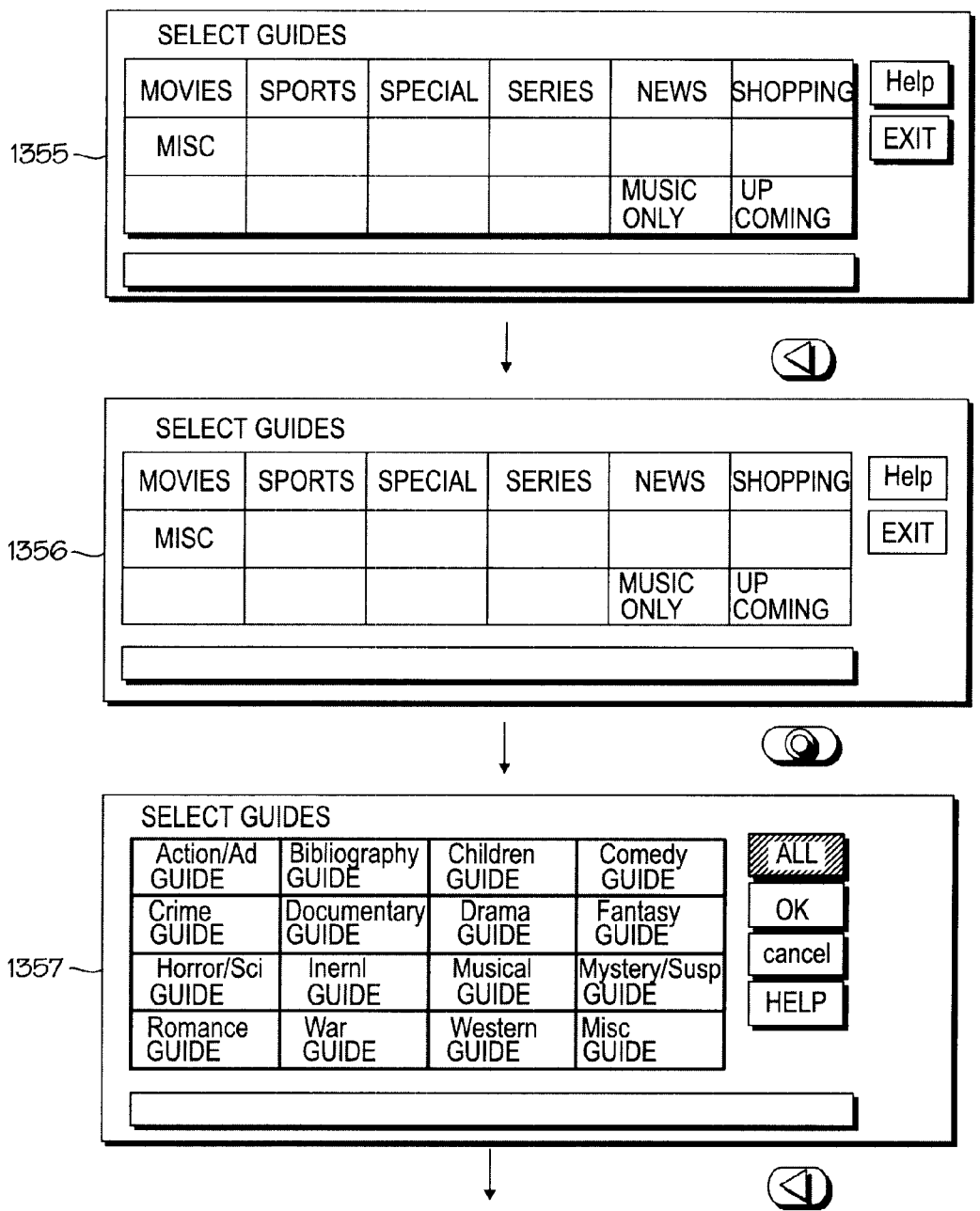
Fig. 13C(1)

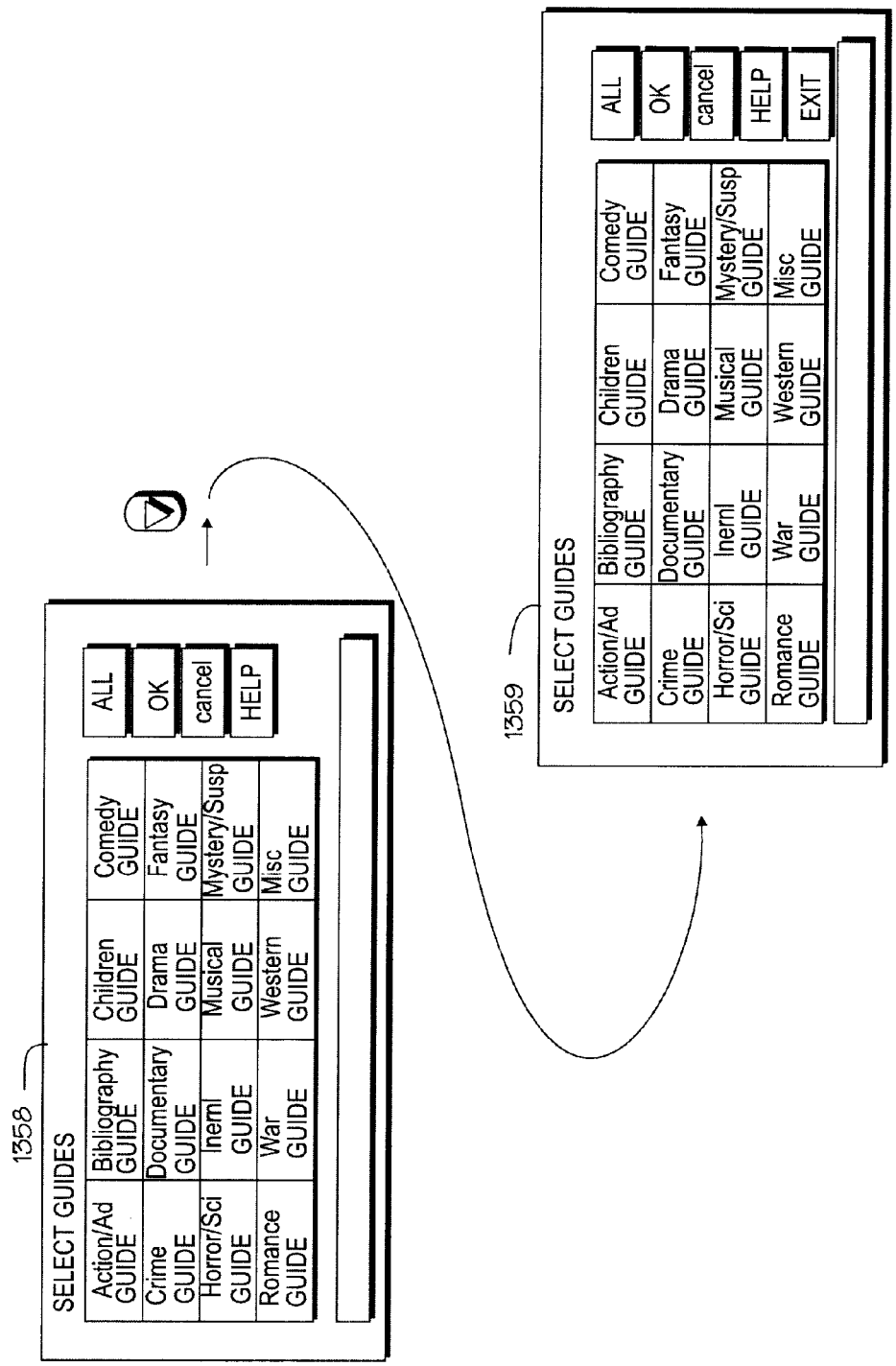
Fig. 13C(2)

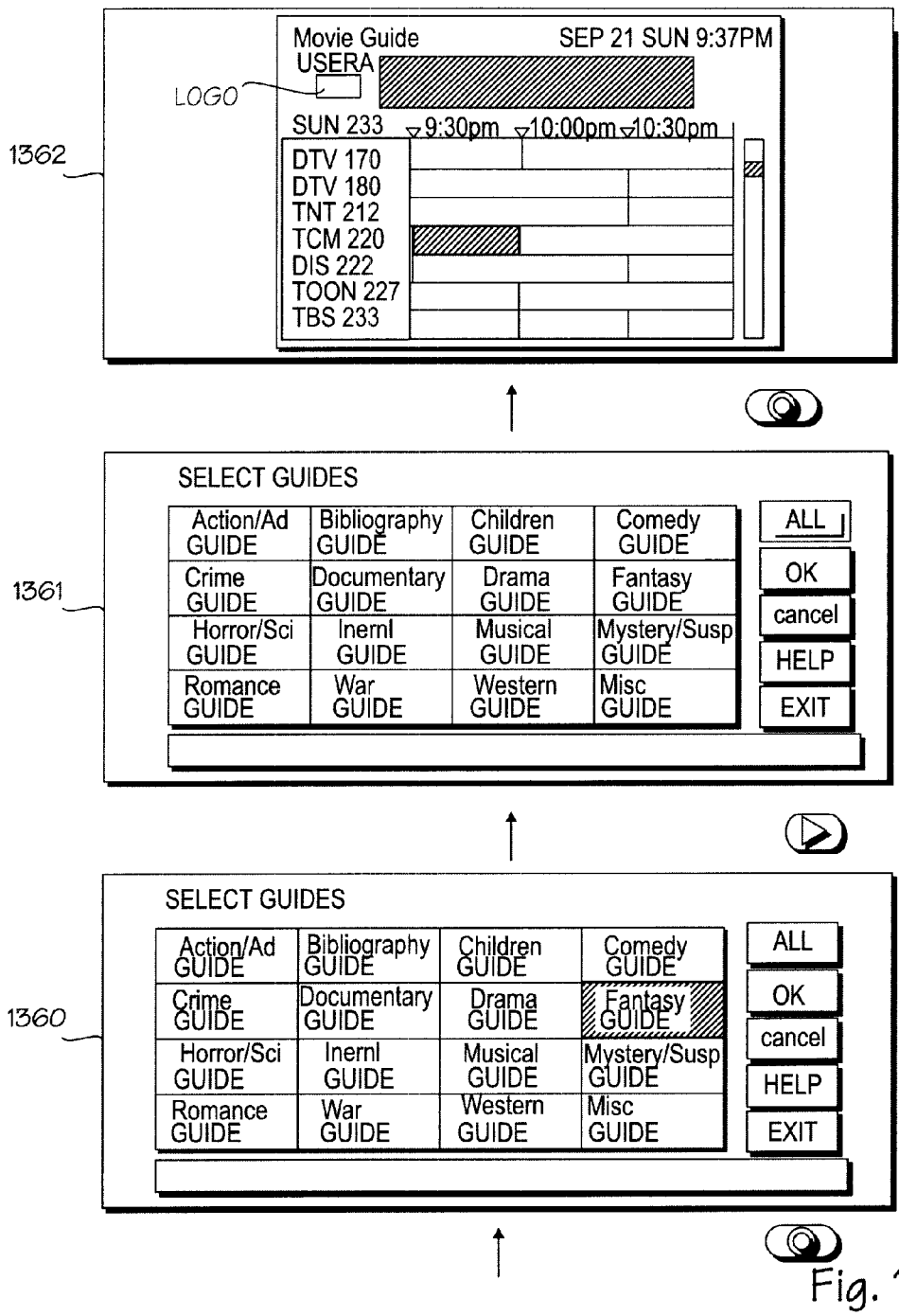
Fig. 13C(3)

METHOD AND APPARATUS FOR PROVIDING FAVORITE STATION AND PROGRAMMING INFORMATION IN A MULTIPLE STATION BROADCAST SYSTEM

FIELD OF THE INVENTION

The present invention relates to the presentation of channel, program, and broadcast information for a multiple channel television system.

ART BACKGROUND

Television broadcasting technology has improved tremendously since its inception. Today, television signals are broadcasted on the airwaves through cables and via satellite. The number of stations accessible today has increased from one to hundreds of stations. To select a program to view, many viewers simply "channel surf" until they find a channel that has a desirable program. Channel surfing refers to the process of using the channel "+" or "−" key to sequentially view each channel. Although some viewers find channel surfing among hundreds of stations enjoyable, most viewers prefer a more direct method for selecting a program to view.

Some systems, for example, the RCA Direct Satellite System™ or DSS™ (Direct Satellite System and DSS are trademarks of Hughes Communications, a division of General Motors Corp.), provides a television channel selection guide which displays a listing of the channels typically in numeric order and the titles of the programs broadcasted or to be broadcasted on the channels. A simplified block diagram of such a guide is illustrated in FIG. 1. The viewer or user of the system may then select the channel by entering in the number or selecting the device. The system responds by removing the guide displayed and tuning to the station selected and displaying the broadcasting signals of the station.

This system has a number of drawbacks. The guide provides only the title of the program. To get additional information, such as a written description of the program, the user must select an information button which responds by bringing up a second layer of the menu having the program description. Thus, as the number of stations increase, the efficiency of reviewing programs and program descriptions decreases. Furthermore, many viewers prefer to view the actual broadcast before determining whether to select that station to watch. Therefore, in the RCA system, the user has to select each station to view, and subsequently go back to the channel guide in order to view program titles on other channels. Of course, the user can always channel surf by skipping from channel to channel in sequence using the channel "+" or "−" buttons.

Typical television viewers will have favorite stations which they like to watch. The RCA system provides a channel skip function in which a viewer or user of the system can designate those channels that they prefer to view by selecting those channels from a displayed list of channels. Thereafter, using the channel "+" or "−" buttons, the user can sequentially view those selected channels.

SUMMARY OF THE INVENTION

It is therefore an object of the present invention to provide a method and apparatus for selection of programs on a multiple station television system.

Furthermore, it is an object of the present invention to provide both broadcast signals and channel data to a viewer to enable the user to select a program to view without requiring the user to maneuver through multiple levels of menus.

In the method and apparatus of the present invention an innovative but easy to use on-line guide is provided to provide the user of the system a wealth of information in a simple format that is easy to understand. Furthermore, the guide enables the user to easily select a particular program to watch. In particular, when the guide is presented to the user, the guide covers only a portion of the actual television screen or display. The remaining portion of the television screen continues to broadcast the currently selected program. As a user scans through the guide and moves the pointer from one station to another, the system responds by automatically tuning to the broadcast pointed to by the pointer and provides the audio and displays the video in the portion of the screen not covered by the guide. Thus, the user can easily get an idea of the broadcast on a particular station without exiting the guide and without expressly selecting a particular channel.

Furthermore, in one embodiment a written description of the program currently broadcasted on a station that the cursor currently points to is also shown. Thus, the user is provided the audio and video of a particular program as well as a written description of the program and the ability to easily preview another station broadcasting another program simply by moving the pointer. Once the user determines that a particular station is to be viewed, the user simply indicates selection by depressing the corresponding key on the receiver or remote control device which then functions to remove the guide. If the viewer exits the guide without selection of a station, the system automatically tunes back to the station that the system was tuned to at the time the guide was entered.

In an alternate embodiment of the present invention, the system provides an innovative mechanism to enable the user to scan program information of channels that the user has designated as his favorite channels. A button is provided that is designated as "favorite". When the user is in a broadcast guide and selects the button, the system responds by displaying program information regarding the favorite stations at the top of the guide. Thus, the user will see at the top of the list the current programming with respect to his favorite stations, followed by program information for the remaining stations.

BRIEF DESCRIPTION OF THE DRAWINGS

The objects, features, and advantages of the present invention will be apparent to one skilled in the art from the following detailed description in which:

FIG. 1 is a simplified illustration of a prior art direct digital satellite system guide display.

FIG. 13C is a descriptive flow diagram illustrating the selection of categories and subcategories.

DETAILED DESCRIPTION OF THE INVENTION

In the method and apparatus of the present invention the broadcast system described is a direct broadcast satellite system. However, it is readily apparent to one skilled in the art that other broadcast systems which have the capability of receiving and displaying a multiplicity of stations may utilize the method and apparatus of the present invention. Furthermore, in the following description, for purposes of explanation, numerous details are set forth, such as menus, flowcharts and system configurations, in order to provide a thorough understanding of the present invention. However, it will be apparent to one skilled in the art that these specific details are not required in order to practice the present invention. In other instances, well known electrical structures and circuits are shown in block diagram form in order not to unnecessarily obscure the present invention.

Figure 2:
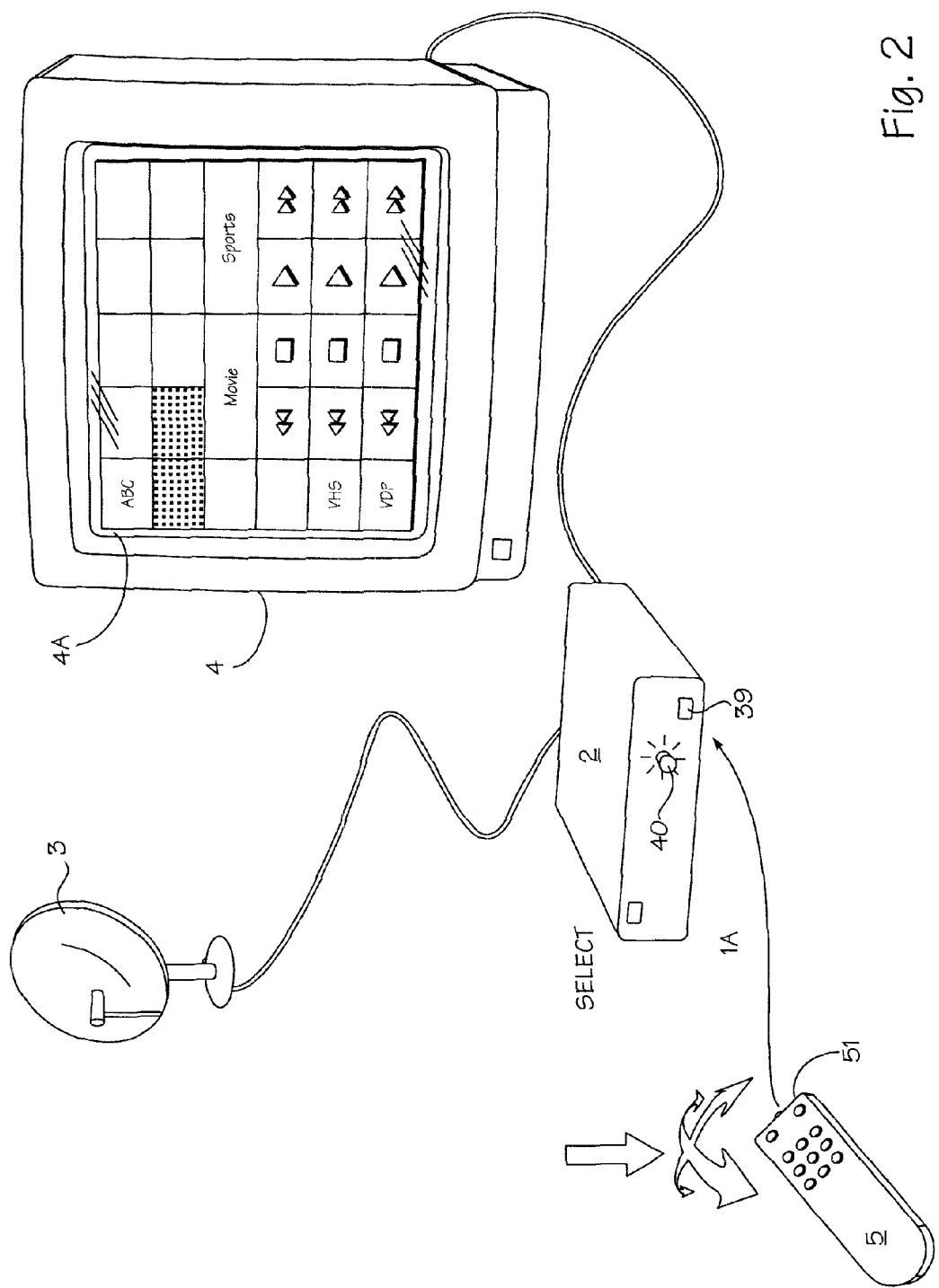
FIG. 2 is a simple illustration of one embodiment of the present invention.

FIG. 2 is a simplified diagram illustrating a Direct Satellite System (DSS). The system has an antenna 3, an integrated receiver/decoder 2 (IRD), a remote controller 5 and a monitor 4. The packets are transmitted by a transponder on the satellite. Each transponder transmits data in a time share manner at a predetermined frequency. A tuner 21 of a decoder is tuned in to the frequency of the transponder corresponding to a channel, which is designated by a viewer so that the packets of digital data are received by the decoder.

The antenna 3 receives an encoded data signal sent from a satellite. The received encoded signal is decoded by the IRD. The antenna 3 has a low noise block down converter 3a (LNB). The LNB 3a converts a frequency of a signal sent from the satellite to another frequency. The converted signal is supplied to the IRD 3. The monitor 4 receives a signal from the IRD 3.

Figure 3:
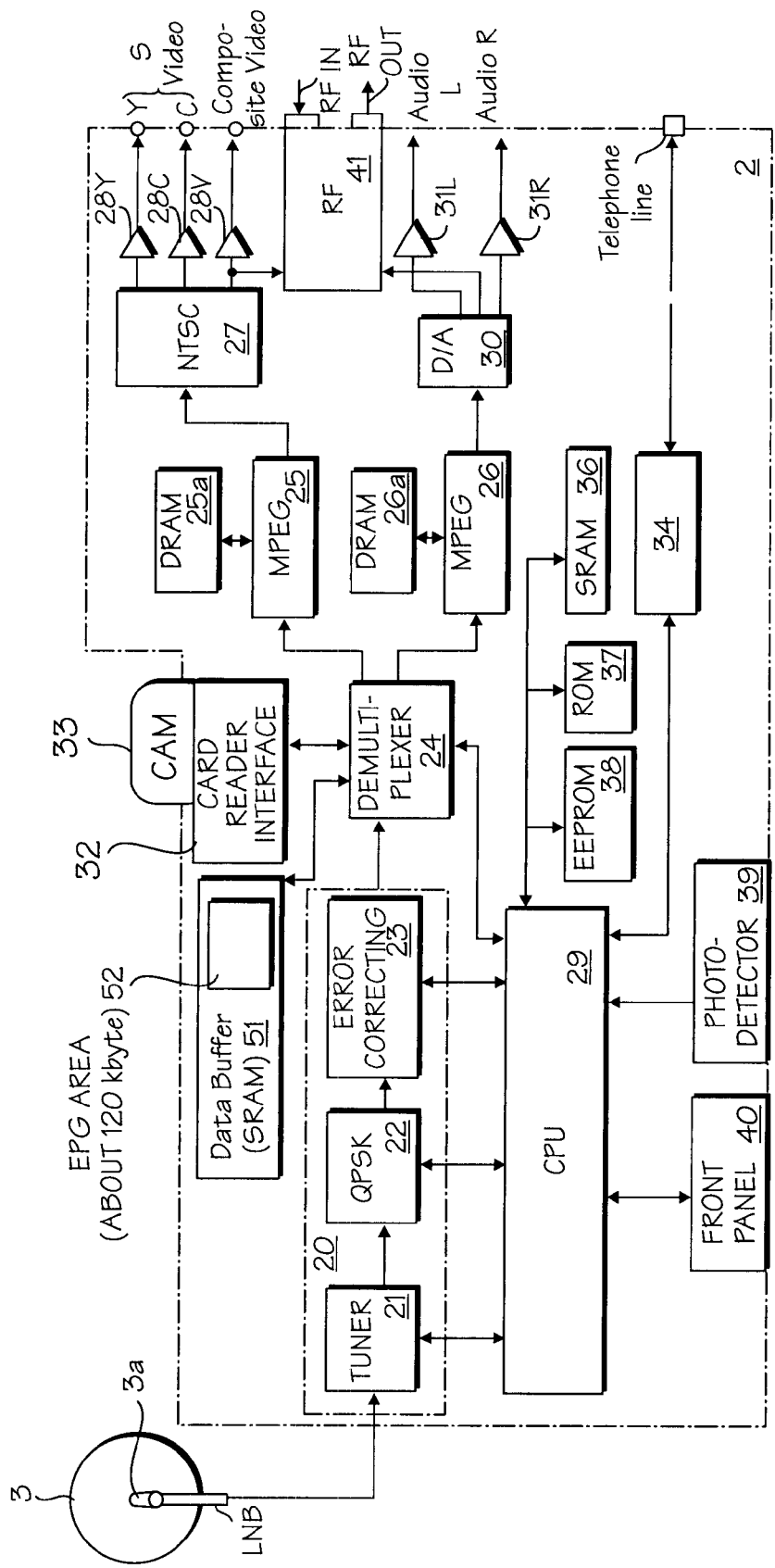
FIG. 3 is a block diagram representation of the elements utilized in the receiver of the television signals.

FIG. 3 is a block diagram of the IRD 3. A radio frequency (RF) signal output from the LNB 3a of the antenna 3 is supplied to a tuner 21 of a front end 20. The output from the tuner 21 is supplied to a QPSK demodulation circuit 22 for demodulation. The output from the QPSK demodulation circuit 22 is supplied to an error correcting circuit 23 for error correction. The data is received in encrypted and encoded (i.e., compressed) form.

The transport IC 24 receives the data stream, consisting of packets of data, from the error correcting circuit 23 and directs portions of the data stream to the appropriate circuit for processing. The digital data stream sent from a satellite includes headers for classifying the different portions of the data in the digital data stream. The transport IC stores the headers in registers and uses the headers to direct the data. The data stream sent from the satellite, includes video data in the format specified by the Motion Pictures Expert Group standard (MPEG), MPEG audio data and electronic programming guide (EPG) data. Data that is identified by its header to be video data is transferred to MPEG video decoder 25. Data that is identified by its header to be audio data is transferred to MPEG audio decoder 26. Similarly, data having a header that identifies the data to be EPG data is transferred to a predetermined area in the data buffer 51 designated to store the EPG.

A conditional access module 33, includes a CPU, a ROM and a RAM. The conditional access module determines whether the user has the authorization to receive certain data, e.g., audio/video for a pay TV station, using the authorization information stored in its memory. Thus, if the conditional access module determines that the user is authorized access, a key to decrypt the incoming data is provided to the transport IC 24, which decrypts the data using the key provided. In the present embodiment, a smart card is utilized. This card is inserted into the card reader interface 32 for interface to the transport IC 24. It is readily apparent to one skilled in the art that the conditional access module is not limited to smart cards and may be configured in other kinds of circuitry.

The MPEG video decoder 25 decodes the video signal received from the transport IC. DRAM 25a, connected to the MPEG video decoder 25, is used for buffering and storage of video data during processing by the MPEG video decoder. The decoded digital video signal is supplied to an NTSC encoder 27 and converted to a luminance signal (Y) and a chroma signal (C) which are respectively output through a buffer amplifier 28Y or 28C as an S video signal. A composite video signal is also output through a buffer amplifier 28V.

The MPEG audio decoder 26 decodes the digital audio signal. DRAM 26a, connected to the MPEG audio decoder 26, is used for buffering of data and information during processing by the MPEG audio decoder 26. The decoded digital audio signal is converted into an analog audio signal by D/A converter 30. The left audio signal is output through buffer amplifier 31L and the right audio signal is output through buffer amplifier 31R.

An RF modulator 41 mixes a composite signal output from the NTSC encoder 27 with an analog audio signal output from the D/A converter 30. The RF modulator 41 converts the mixed signal into an RF signal and outputs the RF signal therefrom.

The CPU 29 is the central control mechanism and executes code stored in the ROM 37 to perform certain functions of the system. For example, the CPU processes certain data to control the generation of the program list in accordance with the teachings of the present invention. In addition, the CPU receives and processes the user input, received from the front panel buttons or switches 40 and the photodetector circuit 39 to provide the user functionality and access to the system described herein. In addition, the CPU accesses user settings/preferences for processing of information and configuration of the system. The user settings are stored in the non-volatile memory, such as EEPROM 38. In addition, the CPU maintains a list of pointers, stored in SRAM 36, to the channel information and program information stored in the SRAM 51. Thus, when a user wishes to display a form of the EPG on the screen, the CPU 29, accessing pointers stored in the SRAM 36, communicates to the transport IC 34 to retrieve the data from the data buffer (SRAM) 51 identified by the pointers. The CPU then formulates the format and other digital data which forms the guide or list on the screen and forwards the data representative of the guide/list to the transport IC 34 which forwards data the DRAM 25a of the MPEG video decoder 25 for subsequent output to the screen.

Figure 4:
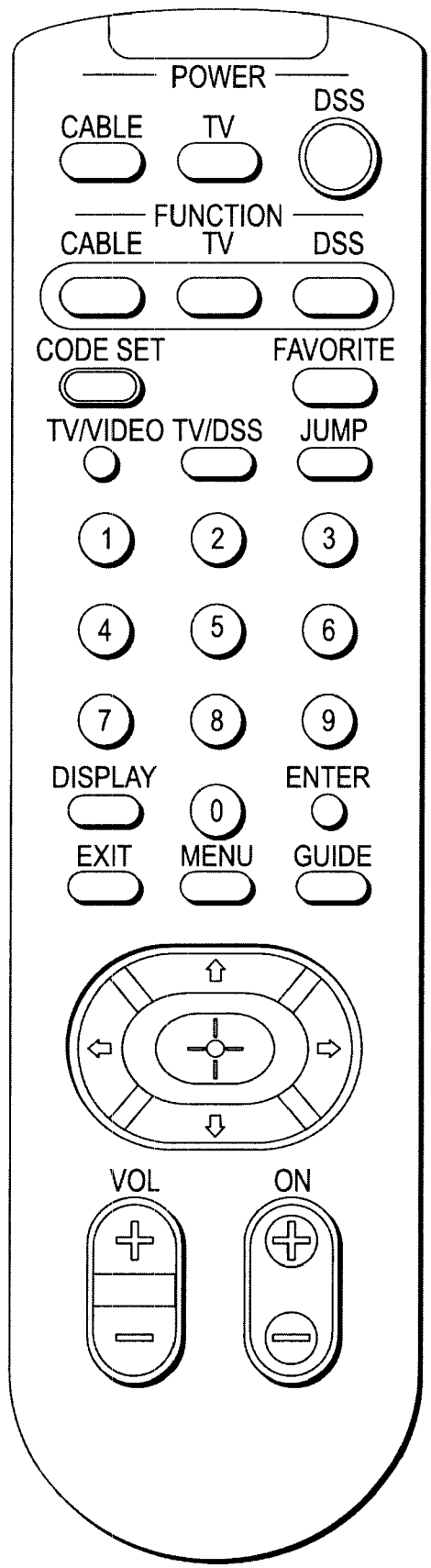
FIG. 4 is a representation of a remote control utilized to tune television stations in accordance with the teachings of the present invention.
Figure 5:
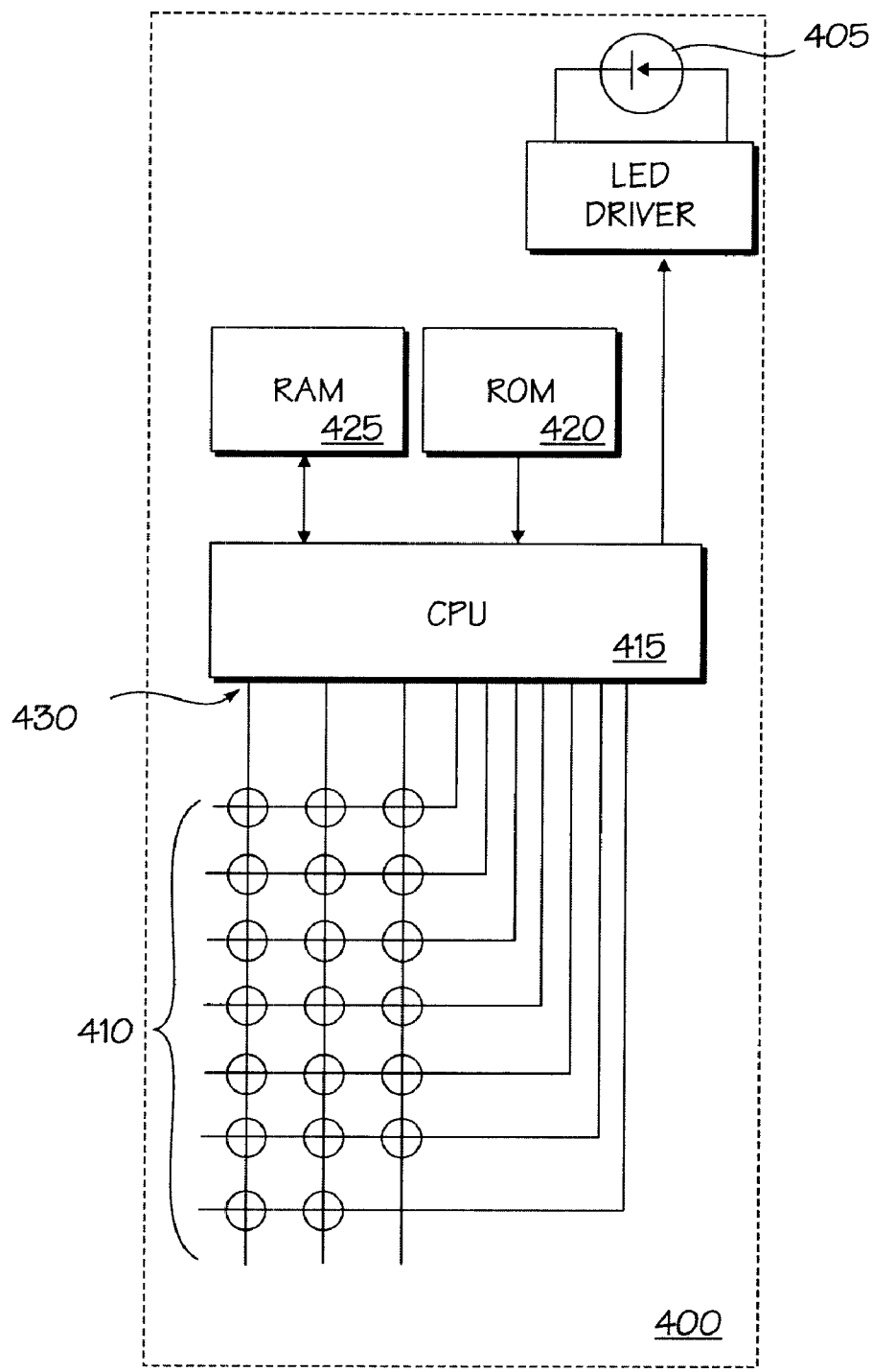
FIG. 5 is a simplified block diagram of the circuitry utilized in a remote control device.

FIG. 4 shows an example of a remote controller utilized by a user to transmit commands and make program selections in accordance with the teachings of the present invention. FIG. 5 is simplified a block diagram of the remote controller. The remote controller 400 has an infrared originating device 405, a set of operation buttons 410, a CPU 415, a ROM 420 and a RAM 425. The CPU 415 receives a signal sent from an operation button 410 through an input port 430. The signal is processed according to a program stored in the ROM 420. The RAM 425 is used as a working space so as to produce a transmitting code. The transmitting code is sent to the infrared originating device 405 through an output port and converted into an infrared signal. The infrared signal is transmitted to the IRD. The operation buttons 410 include a direction key for designating a pointer direction such as north, south, east and west, an "EPG" key, a "FAVORITE" key, a "SELECT KEY", a "MENU" key, an "EXIT" key, a ten-key numeric keypad and an "ENTER" key. The set of operation buttons 410 enable the user to select programs through the electronic programming guide in accordance with the teachings of the present invention.

Figure 6:
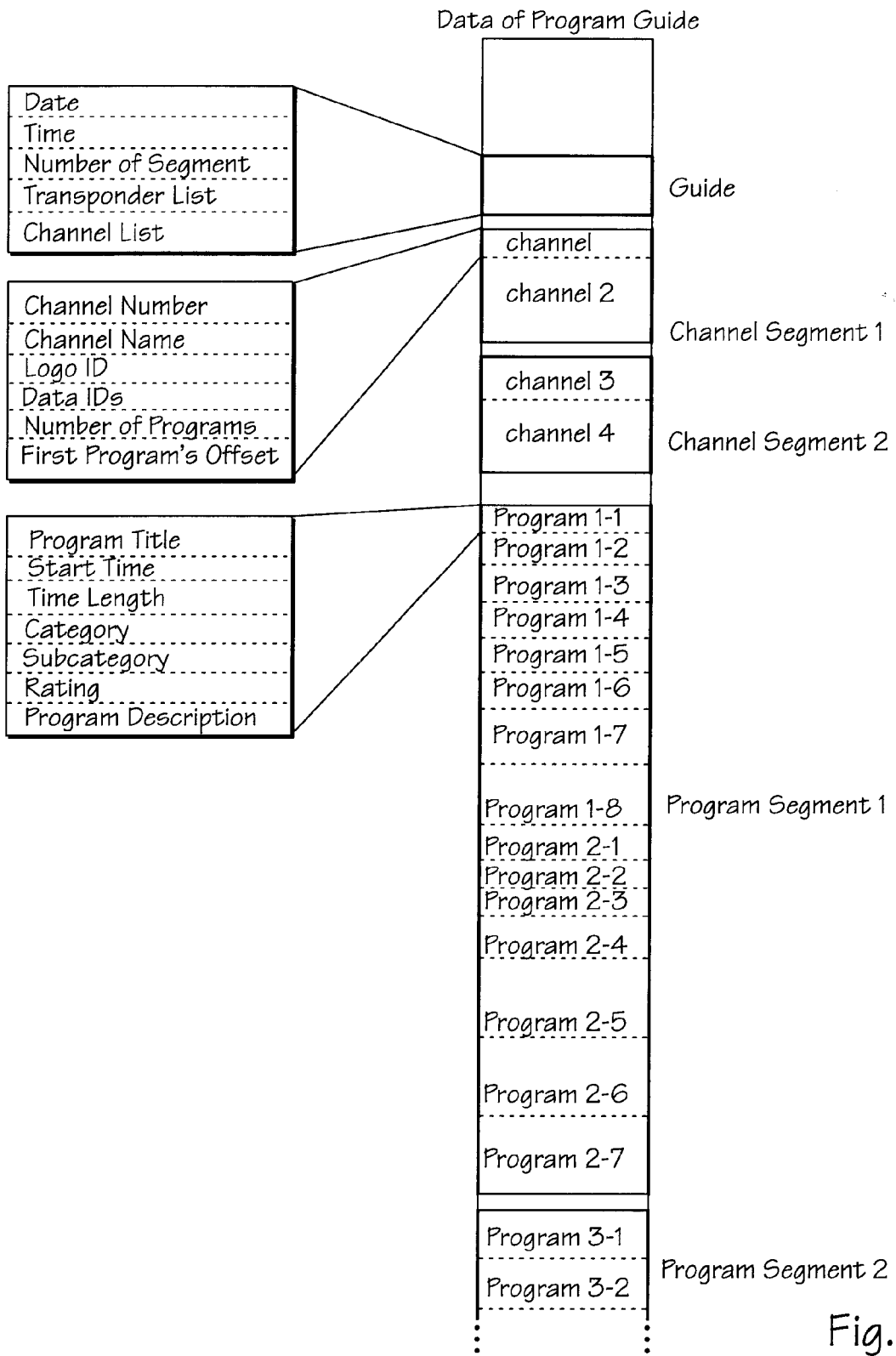
FIG. 6 illustrates the type of data utilized to present the electronic program guide in accordance with the teachings of the present invention.

FIG. 6 is a block diagram illustration the data stored in a portion of the data buffer RAM 51. As noted above, the RAM 51 stores EPG data including guide data, channel data and program data. General information is included in the guide data, for example, the current data and time. The transponder list identifies the number of the transponder transmitting a segment. The channel list identifies the channel number of the first channel of a portion of data. The channel data includes data relating to channels, such as the channel number, channel name (i.e., the call sign of a broadcast station), logo ID (i.e., an identification of the channel logo), data ID, which is an identification of a channel number of MPEG video data or MPEG audio data, number of programs, which identifies the number of programs to be transmitted on a channel during a predetermined time frame, first program offset which identifies the offset from the header to the first channel data in a segment.

The program data includes the program title, start time of the program, time length of the program, program category such as movies, news, sports, etc., program sub-category such as drama, horror, children's movies or baseball, basketball, football for the sports category, the movie rating and program description that provides a detailed description of the program.

Figure 7:
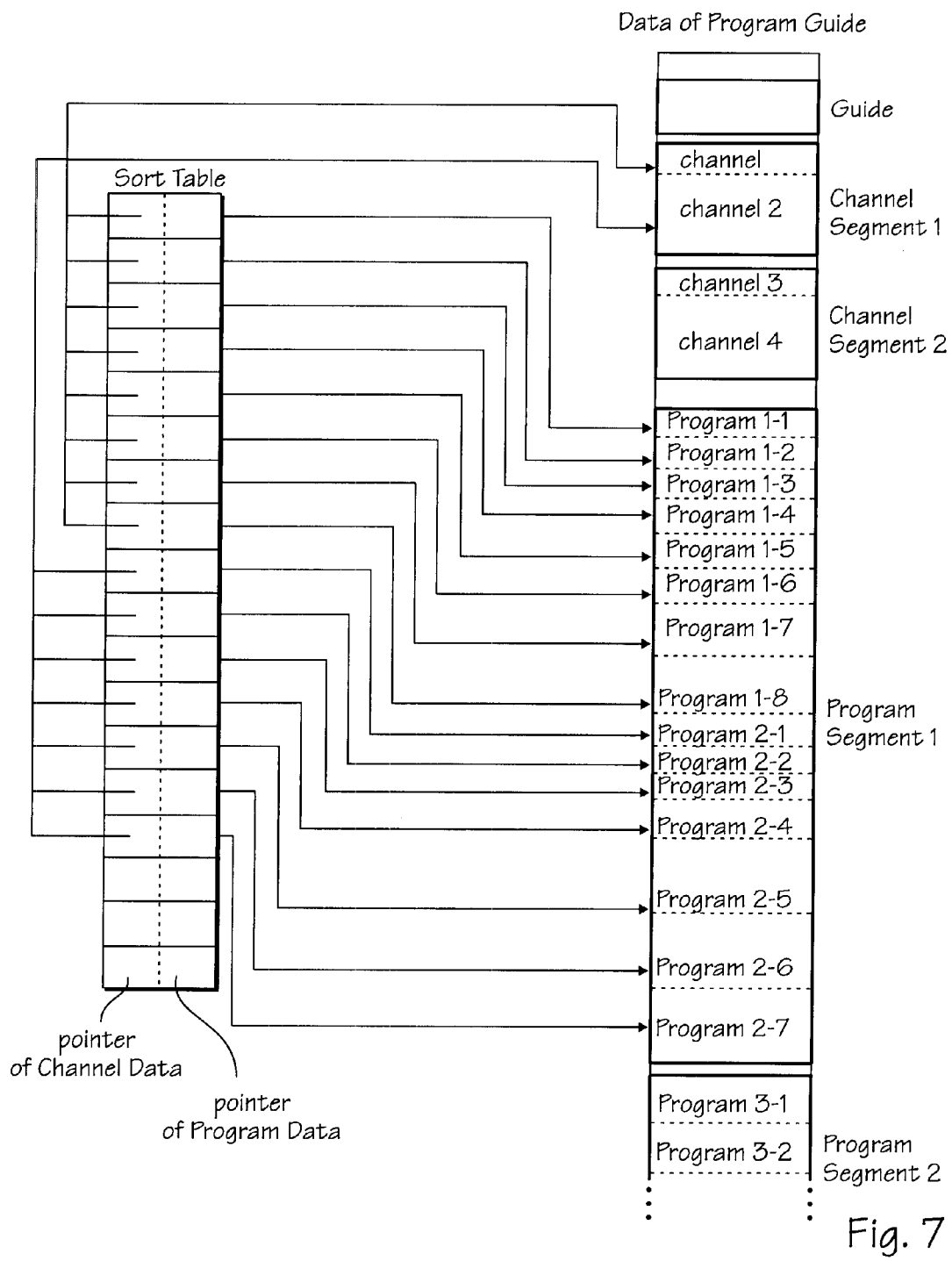
FIG. 7 illustrates the pointers to the data utilized to generate the electronic program guide in accordance with the teachings of the present invention.

FIG. 7 illustrates how pointers to the EPG data is sorted for display of a guide on the user's television screen. As noted above, EPG data includes guide data, channel data and program data which are stored in the Data Buffer (RAM) of IRD (as shown in FIG. 3). When a viewer selects a channel, the CPU of the system determines the packet containing the channel information and extracts the transponder number from the channel information. The system front end starts tuning in the frequency of the designated transponder so as to receive the data transmitting from that transponder. If a viewer does not select any channel, the last channel is designated.

As noted above, the CPU generates a table of pointers 736 to the EPG stored in the memory. The table 736 is used for changing the order of channels or programs according to the information to be presented in the guide to the user. The table 736 includes an entry for the address pointer to the corresponding channel data and an entry to the corresponding program data.

A table for generating display information is stored in the ROM 37. Certain data from the table is read out from the ROM 37 and stored in DRAM 25a. Preferably the data is stored in compressed form. Therefore, when a character is displayed on a screen, the compressed character array is decoded so as to generate the character to be displayed. The encoder references a dictionary which includes a set of words and frequently used portions of words and numbers corresponding to each word or portion of a word. The encoder encodes each word to each number by using the dictionary. The decoder references the same dictionary as the encoder to perform the decode function. Once decoded, each character of the decoded word includes a character code corresponding to an ASCII code. Nonvolatile memory (e.g., EEPROM 38) has two tables. The first table contains character bitmaps in the different fonts available for each character. The second table identifies the address in the first table at which to extract the character bitmap. The address is determined according to the character code. The bit map image of the character is transmitted to DRAM 25a and subsequently accessed to display the character on the screen.

In the present embodiment, the channel data is received from a predetermined transponder and the channel number and channel name are stored in DRAM 25a. Additional channel information such as the channel logo is stored in the ROM 36. The ROM 36 preferably includes a table of Logo IDs and the address of Logo Data stored in ROM 36. Therefore, once a Logo ID is determined, the address of the Logo Data is determined, retrieved and stored in DRAM 25a.

The channel data provides the beginning address of the program data for a particular program. The actual location on the screen the program information is displayed is dependent upon the format of the guide. For example, in a time-based system, the location where the program title is displayed is determined by the start time and time length stored in the program data.

Figure 8:
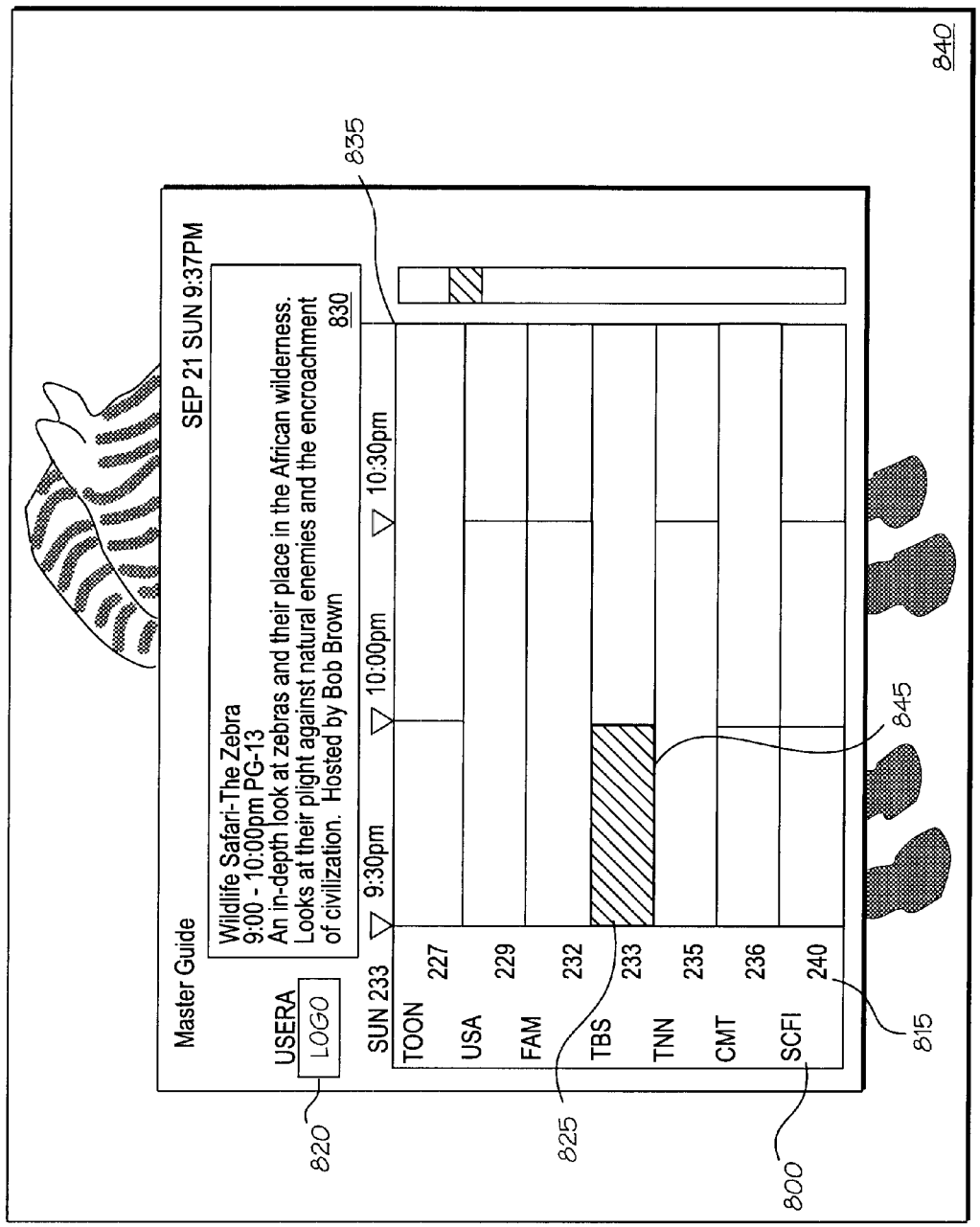
FIG. 8 illustrates the Master Guide presented to enable the viewer to view programming that is broadcast and is to be broadcast.

Using this information downloaded from the satellite transmission, programming and channel selection information is provided to the viewer. In the system and method of the present invention, this information is provided to the user in an innovative manner in order to enable the viewer to easily determine and select stations or programs to be viewed. For example, FIG. 8 illustrates a Master Guide that provides such information as the channel call sign 810, channel number 815 in the system, the channel logo of the selected station 820, a highlight 825 indicating the location of the system pointer operable by the arrow direction buttons, a program description 830 for the program the system pointer is located at, as well as program time information 835.

This guide is superimposed on the broadcast of channel 840 at which the system pointer is located. Thus, the user not only is provided the television system data showing the television channels, times of broadcasts of programming and descriptions of programs, but is also provided the audio and video of one channel, all on the same menu level of the guide. By movement of the pointer 845 (in the present example, by manipulation of the information highlighted), the channel tuned to will change automatically, enabling the user to stay in the menu while still previewing in part the actual channel highlighted on the guide. This process is illustrated by FIGS. 9A, 9B, and 9C.

Figure 9A:
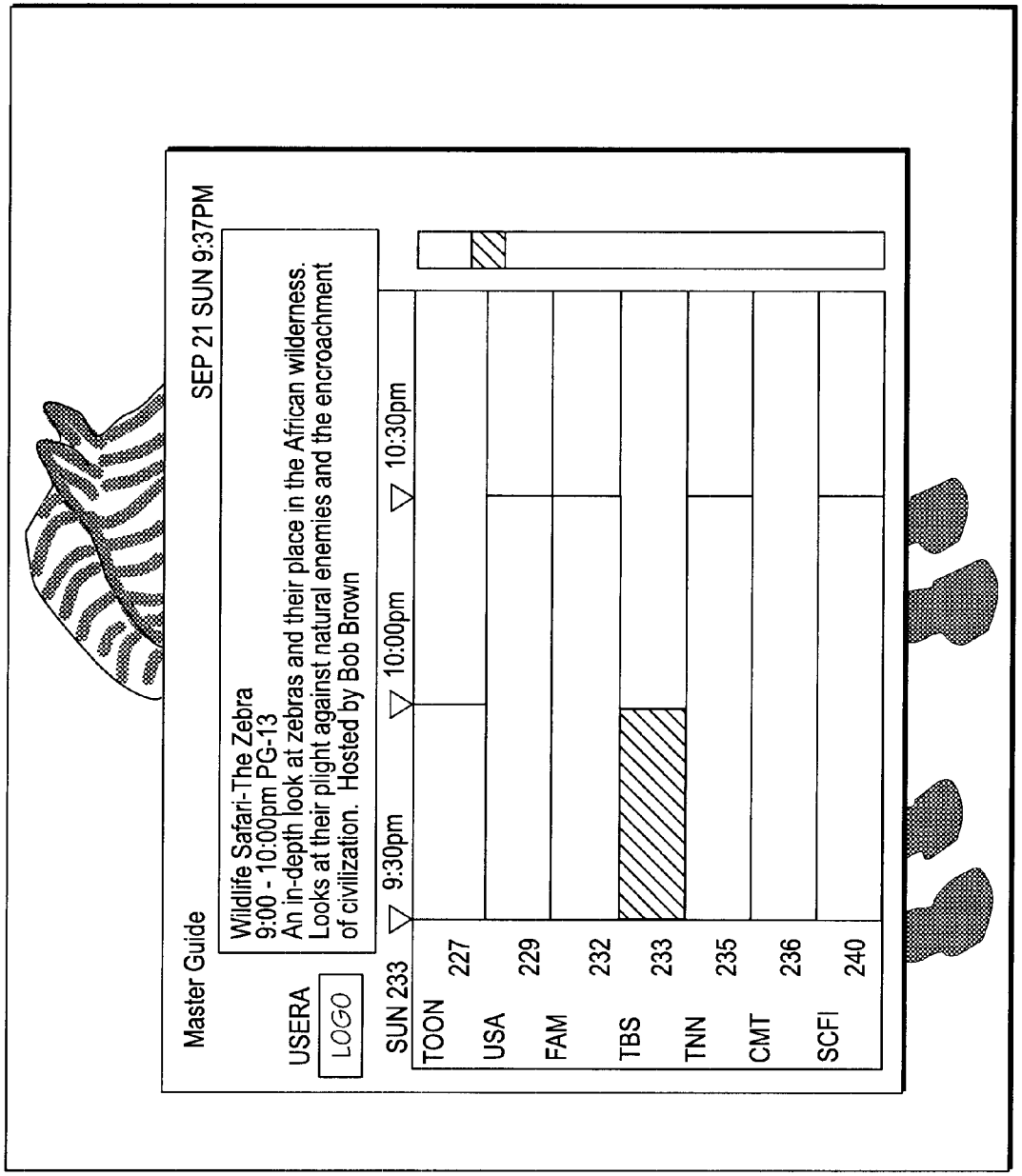
FIGS. 9A, 9B and 9C illustrate one embodiment of the present invention in which a broadcast audio and video is displayed behind the Master Guide to enable the viewer to easily determine programs to watch without the need to navigate through multiple levels of menus or to switch between menus and broadcasts.
Figure 9B:
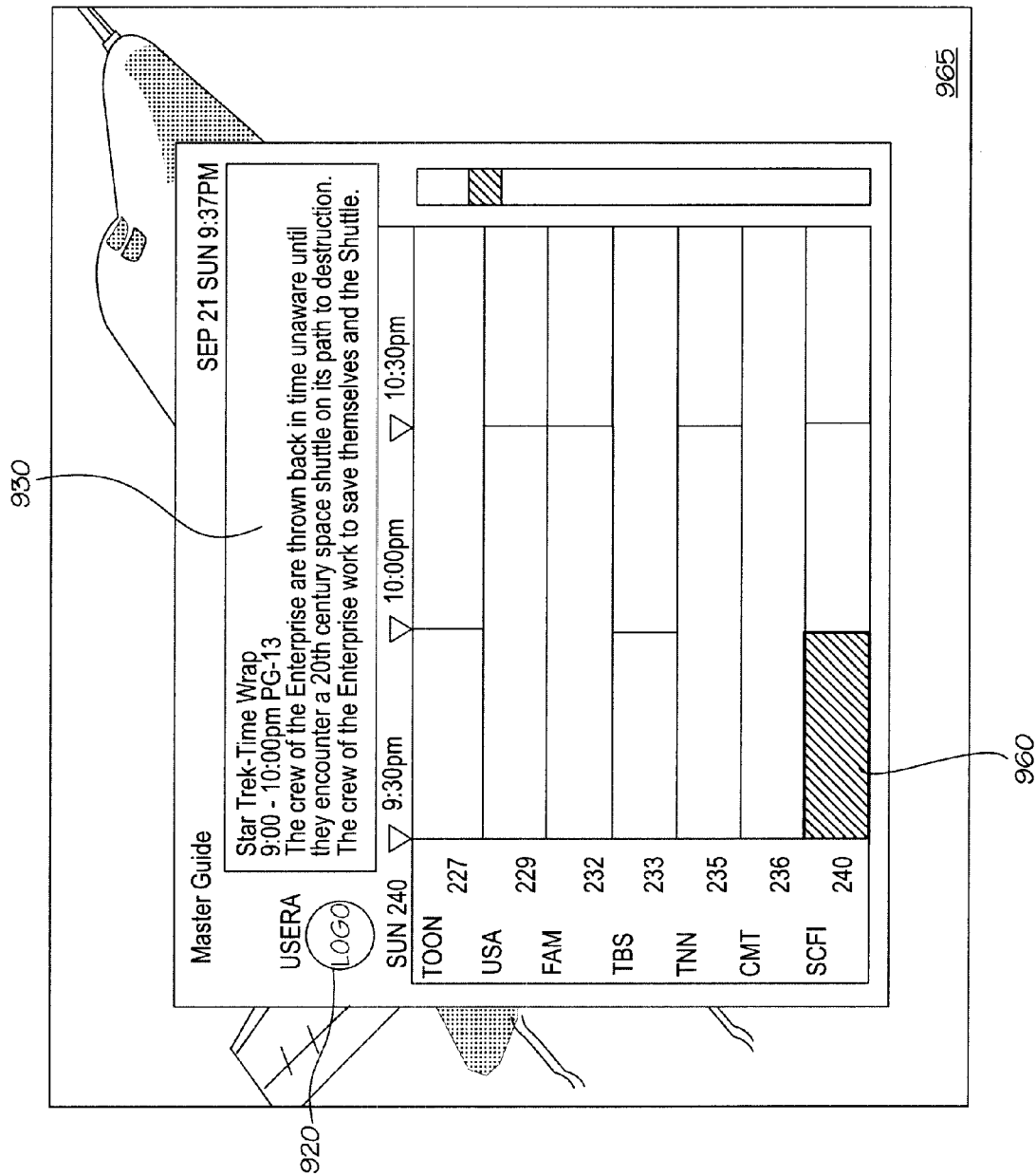
Figure 9C:
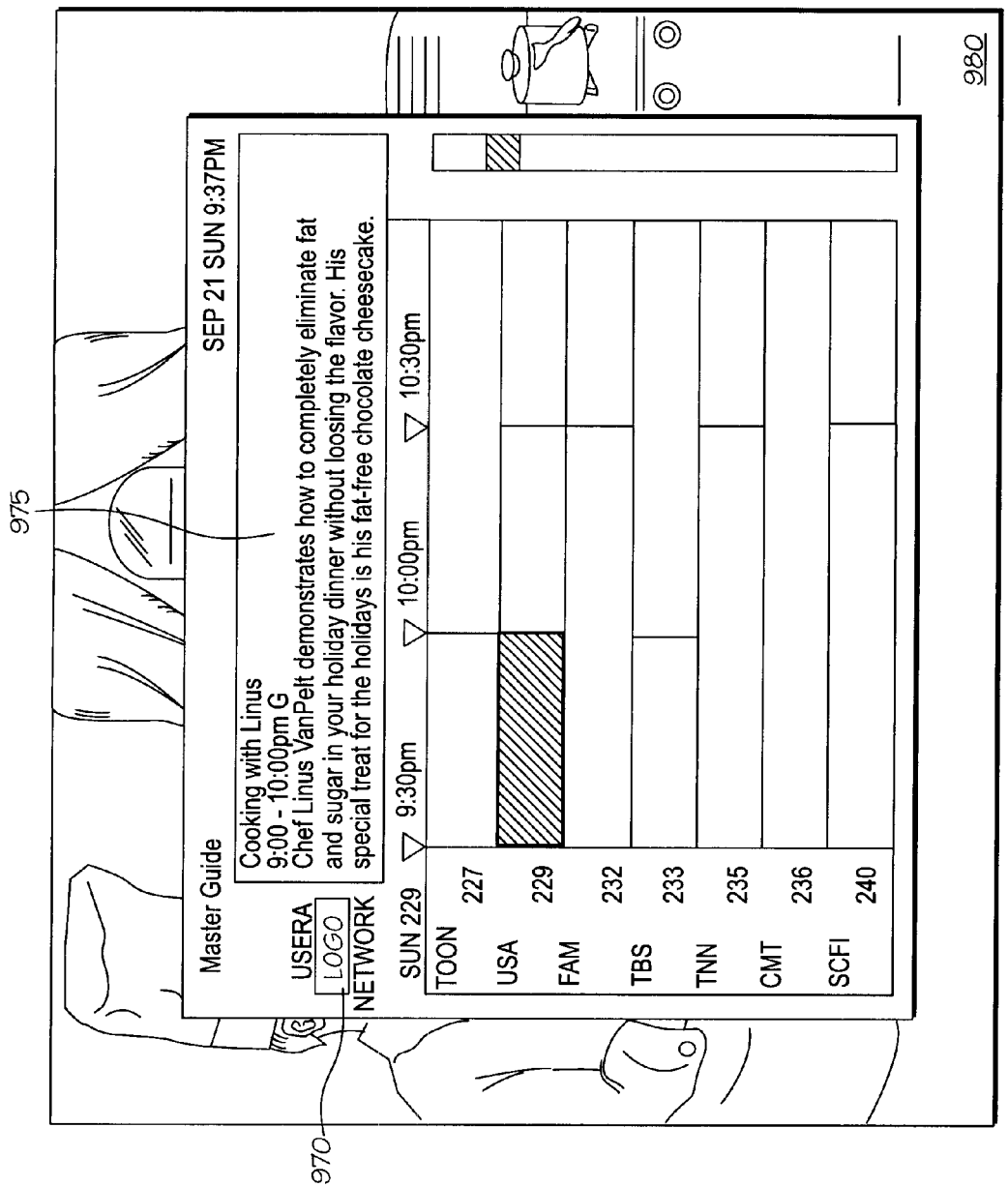

Referring to FIG. 9A, the program currently broadcast on TBS is currently displayed in the background 940. If the viewer were to move the pointer by a joystick or similar device or by simply pressing the appropriate arrow keys to highlight a different channel, such as the SCFI station 960, the system responds by tuning to the SCFI station 960 in order to provide the audio and video in the background display 965 of the program currently on the SCFI network. It follows that the program description 930 and the identification 920 of the currently displayed channel also change. If the user wishes not to select that program currently on the SCFI network he can use a control device, such as his remote control, to move to another station such as the USA station 970, and again, the system automatically responds by tuning to that particular station, retrieving the program information to display in the program area 975, and broadcasting the audio and video of the current program on that channel 980.

If the user wishes to select the channel 980, the user indicates selection by depressing the appropriate key on his control device. The system then responds by removing the guide, leaving the audio and video of the tuned station for the user to view. If the user does not select the channel 980 and simply exits the guide, the system returns back to the channel tuned to when the guide was entered, in the present example, the TBS network. Thus the present invention provides useful information to the viewer to enable the viewer to easily determine programs to watch without the need to navigate through multiple levels of menus or to continuously switch between menus and broadcasts. This has been briefly illustrated in FIGS. 9A, 9B and 9C and will be described in further detail below.

Figure 10:
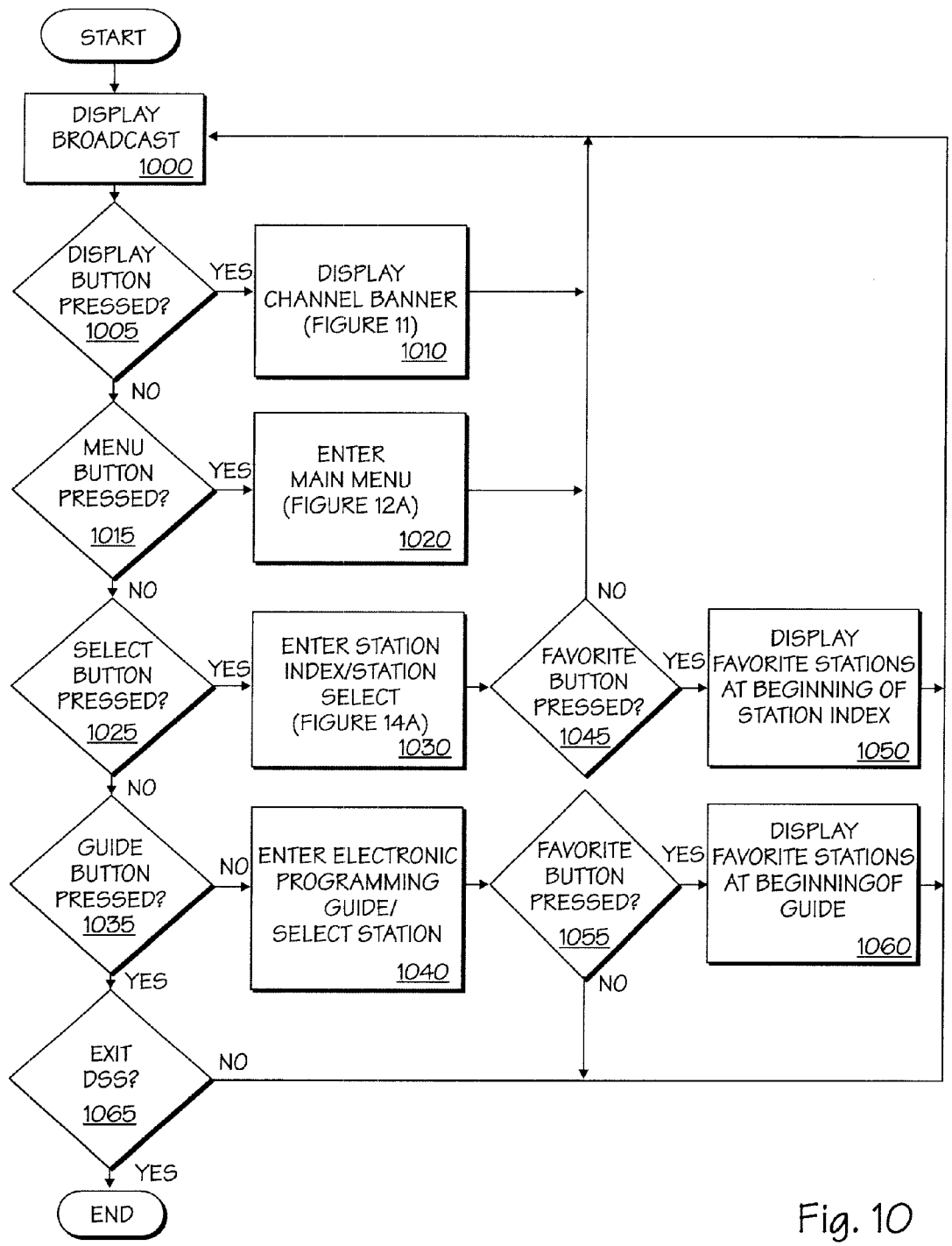
FIG. 10 is an exemplary flowchart illustrative of the functionality provided in one embodiment of the present invention.

The discussion will now turn to the general process flow for one embodiment of the present invention. FIG. 10 is an illustrative flow diagram of the functionality provided in one embodiment of the present invention. It is readily apparent to one skilled in the art that additional functions can be added and functions modified or removed and still be within the spirit and scope of the invention. The system provides an innovative and user-friendly access to a wealth of information regarding programming available through the broadcasting system. In the present invention, a number of functions are selectable through the remote control device. It is apparent that these functions may be selectable through other devices such as a joystick or tablet or other means such as an on-screen menu.

Referring to FIG. 10, a television screen or display is currently showing a broadcast of a selected station 1000. The system monitors the states of the buttons on the user's remote control device to determine when the user has depressed a certain button. Implementation of monitoring, e.g., polling, interrupt driven events, are well known in the art and will not be discussed further herein.

Figure 11:
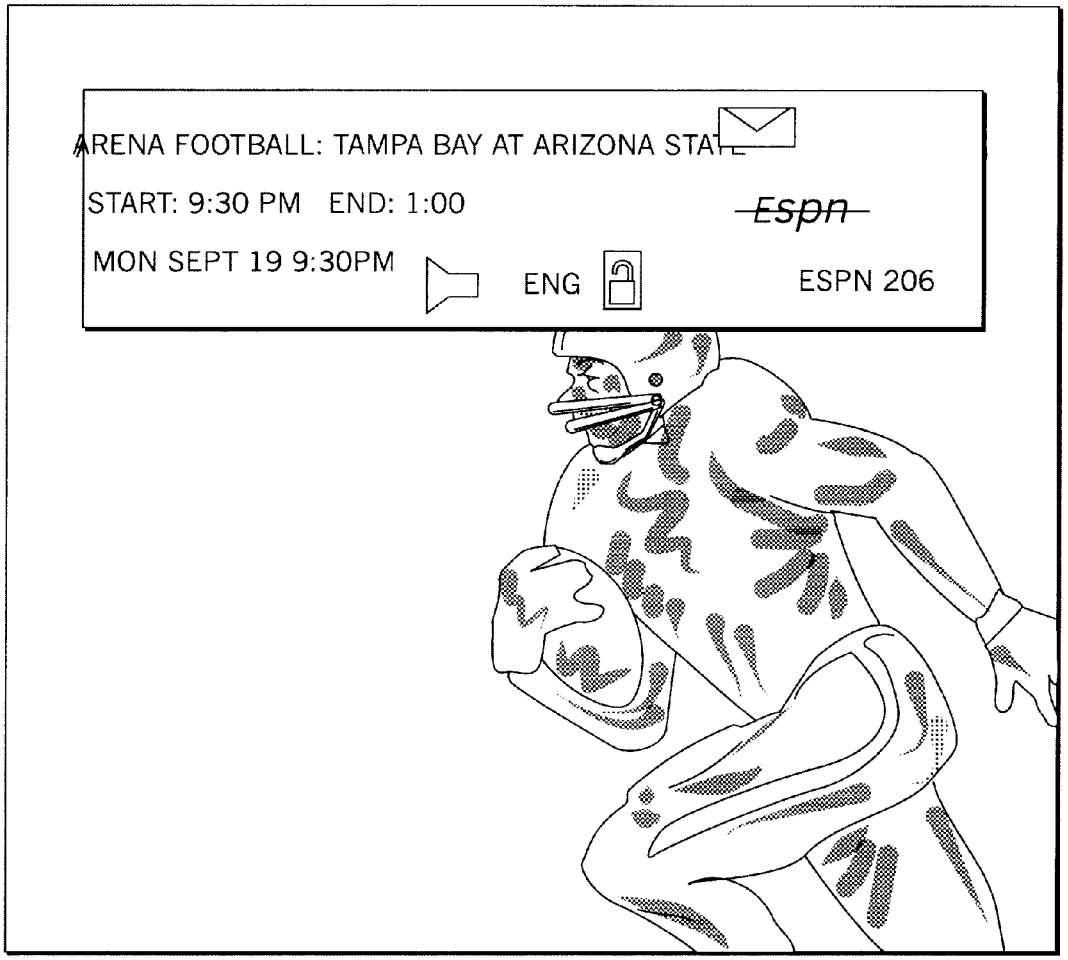
FIG. 11 is an illustrative display of a channel banner.

At step 1005, if the display button is pressed, at step 1010 the channel banner is displayed. This channel banner is superimposed over the displayed broadcast to identify to the user such things as the current station, the program currently played, the start and end time of the program, as well as some additional information such as the current date and time. An exemplary display is shown in FIG. 11.

Figure 12A:
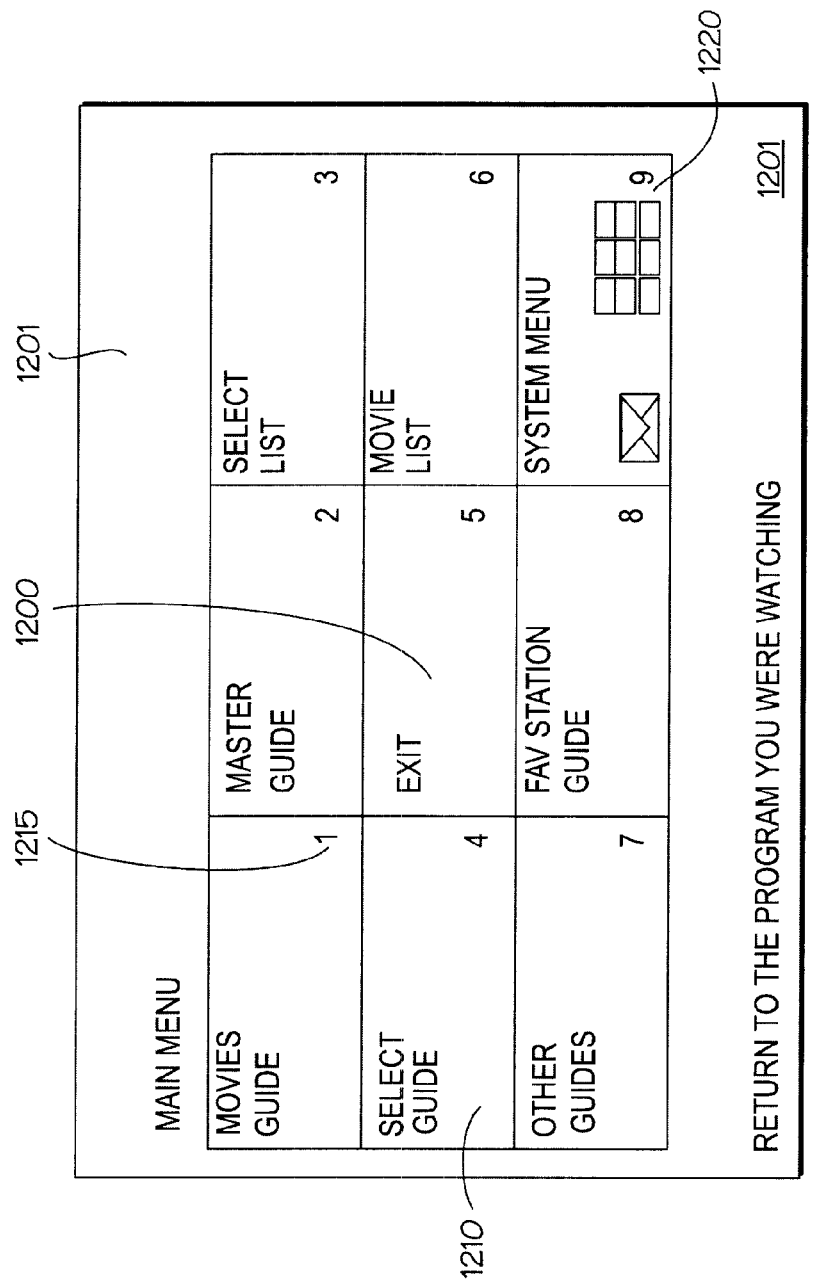
FIG. 12A is an exemplary display of the main menu of one embodiment of the present invention.

Referring back to FIG. 10, if the menu button is pressed, step 1015, the system retrieves and displays the main menu, step 1020, enabling the user to perform such functions on screen such as viewing different guides or lists, setting system functions, viewing attractions, and purchasing pay-per-view programs. The main menu has items which are arranged in the 3×3 matrix. The center item, shown in FIG. 12A, is used to exit the menu. Other items enable the user to select guides or program lists. In addition the user can enter the system menu shown in FIG. 12B, or the user settings menu 1210 shown in FIG. 12C.

When the user initially enters the main menu 1201 the pointer is e currently positioned at the center of the menu 1200 enabling the user to immediately exit the main menu 1201 if inadvertently entered. Once in this menu the user can select an item using the display cursor or highlight keys such as the up arrow and down arrow and right and left arrow keys on the remote controller, or by depressing one of the numeric keys which corresponds to the numeric identifier, e.g., identifier 1215 for the movie guide. This physically corresponds with the arrangement of the actual numeric keys on the remote controller. Furthermore, if an item has a submenu this is represented by a corresponding icon such as the icon 1220 for system menu 1250. It should be noted that when these menus are displayed, the menus are displayed superimposed over the current broadcasted station enabling the user to navigate through the menus to enable/disable certain functions or selection while still keeping the broadcast active and displayed in part.

Figure 12B:
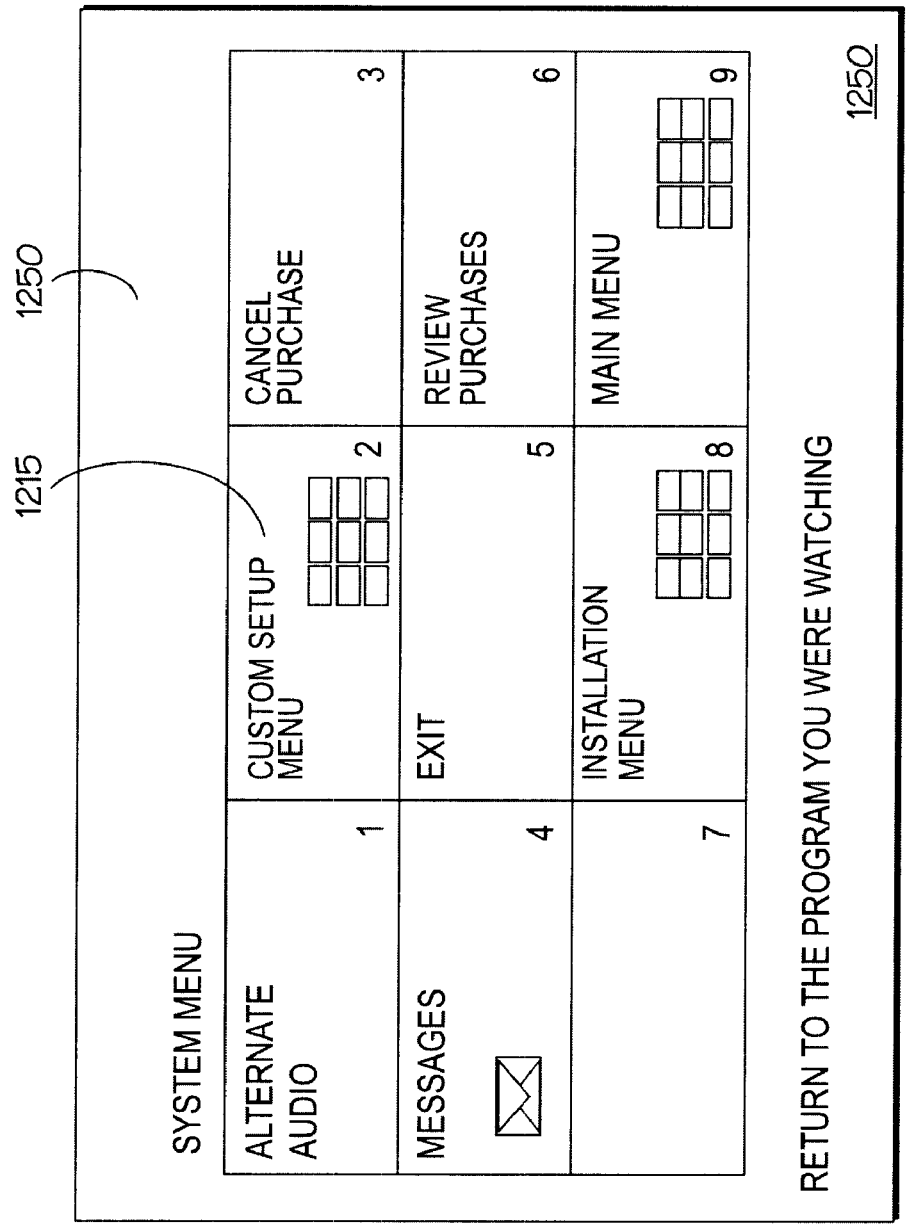
FIG. 12B is an example of the system menu in one embodiment of the present invention.
Figure 12C:
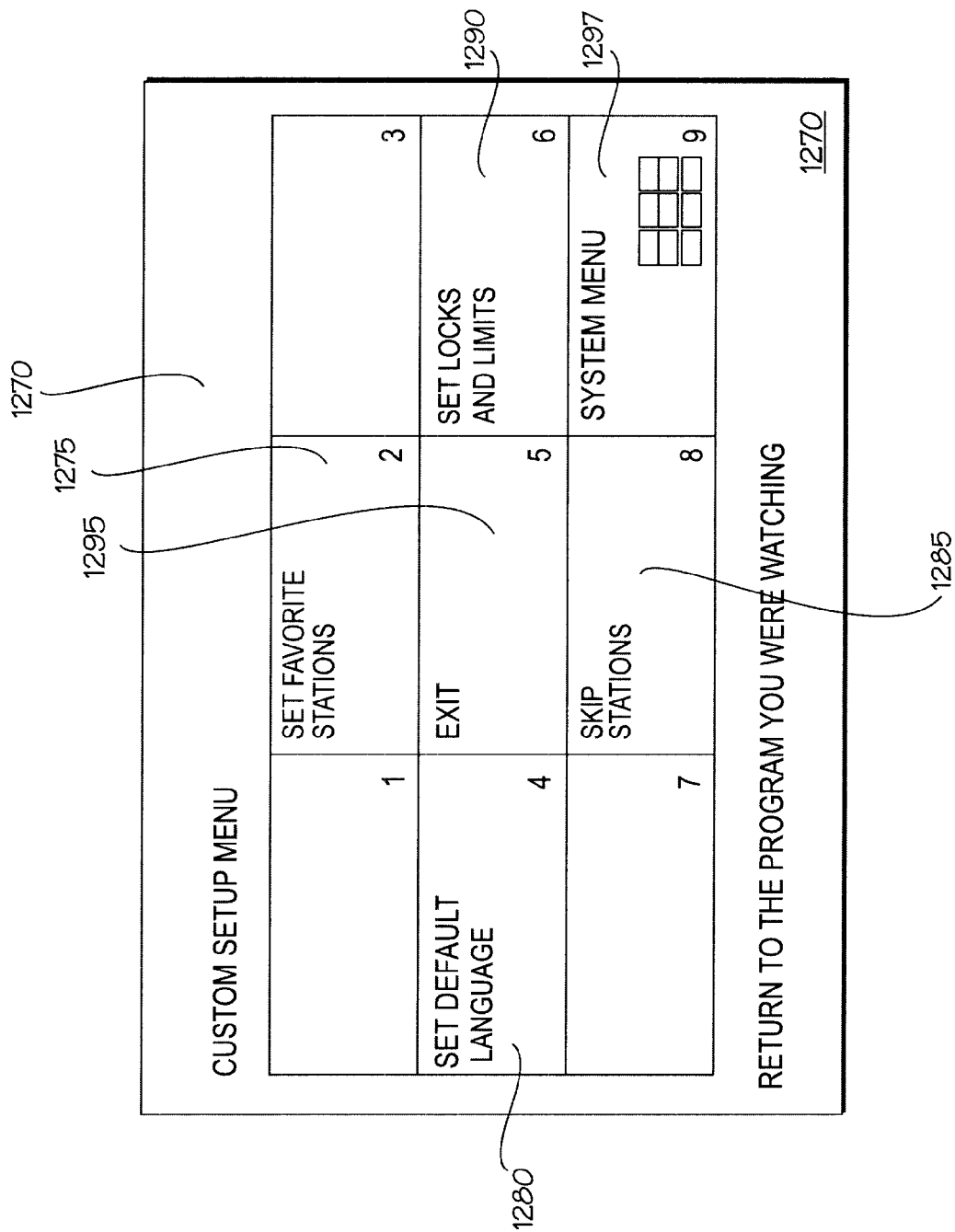
FIG. 12C is illustrative of a custom setup menu in one embodiment of the present invention.
Figure 12D:
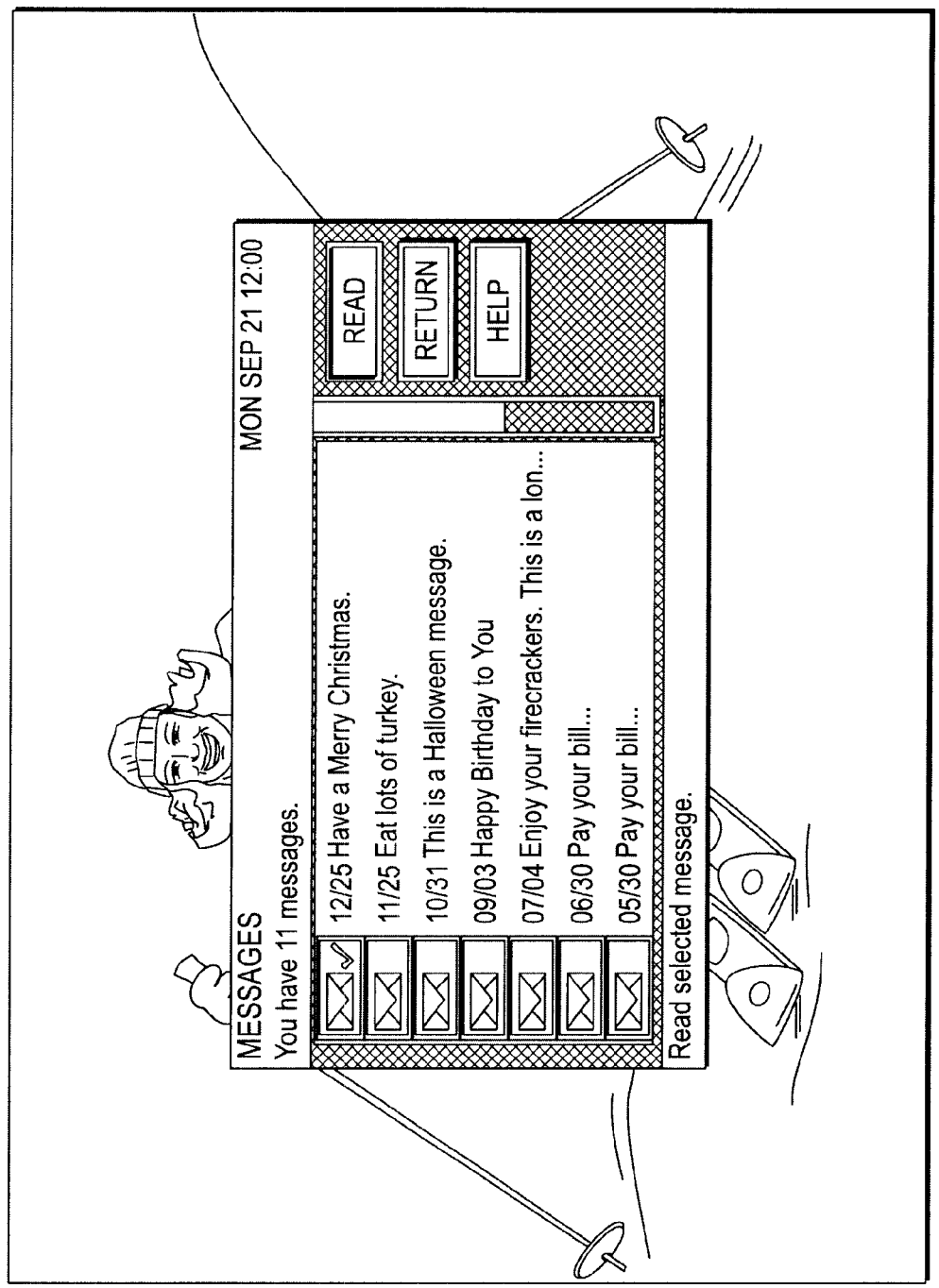
FIGS. 12D, 12E and 12F illustrate the electronic messages feature.
Figure 12E:
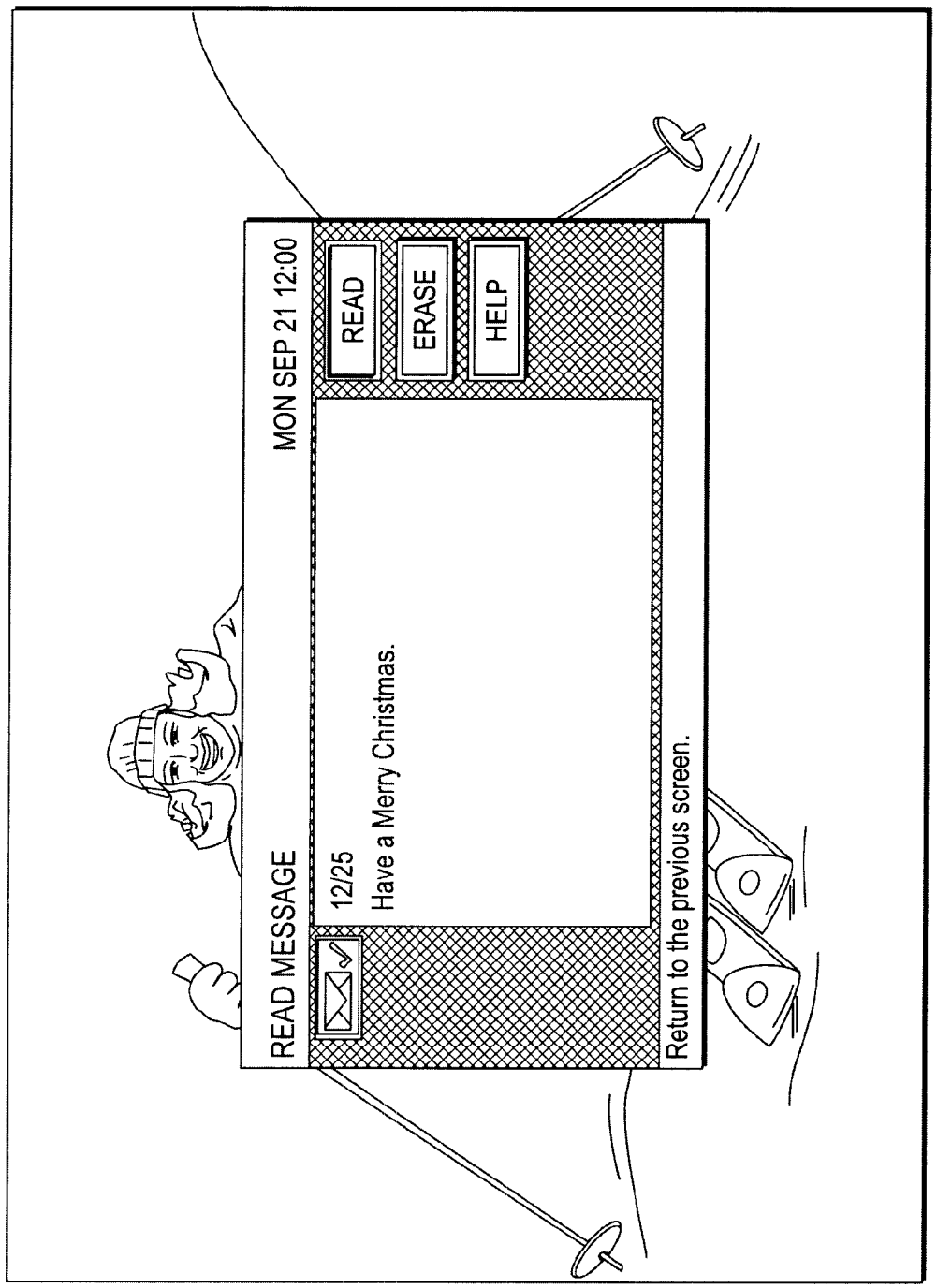

The system menu selected through the main menu of FIG. 12A is shown in FIG. 12B. This menu 1250 functions similarly to the main menu through use of the arrow keys or direct selection of items by depressing a particular numeric value from the numeric keypad located on the remote control device. The system menu provides the user access to electronic mail messages through the messages box 1251. The mail icon informs the user that he has unread mail. In response to selection of the messages box 1251, the system provides a list of the user messages as shown in FIG. 12D. Upon selection of a message to read, the box displays the message as shown in FIG. 12E. FIG. 12C is illustrative of the custom setup menu shown in FIG. 12B, item 1255.

Referring to FIG. 12C, through the the custom setup menu, the user can personalize guides and menus utilized when operating the broadcast system. For example, referring to FIG. 12C, the custom setup menu 1270 provides options such as the setting of favorite stations 1275, setting default language 1280, setting stations to skip when reviewing stations (skip stations) 1285, and setting locks to stations and limits on viewing 1290. The user also has the option of exiting the entire menu whereby the broadcast is completely displayed on the screen 1295, or going back to the system menu, FIG. 12B, 1297.

Figure 12F:
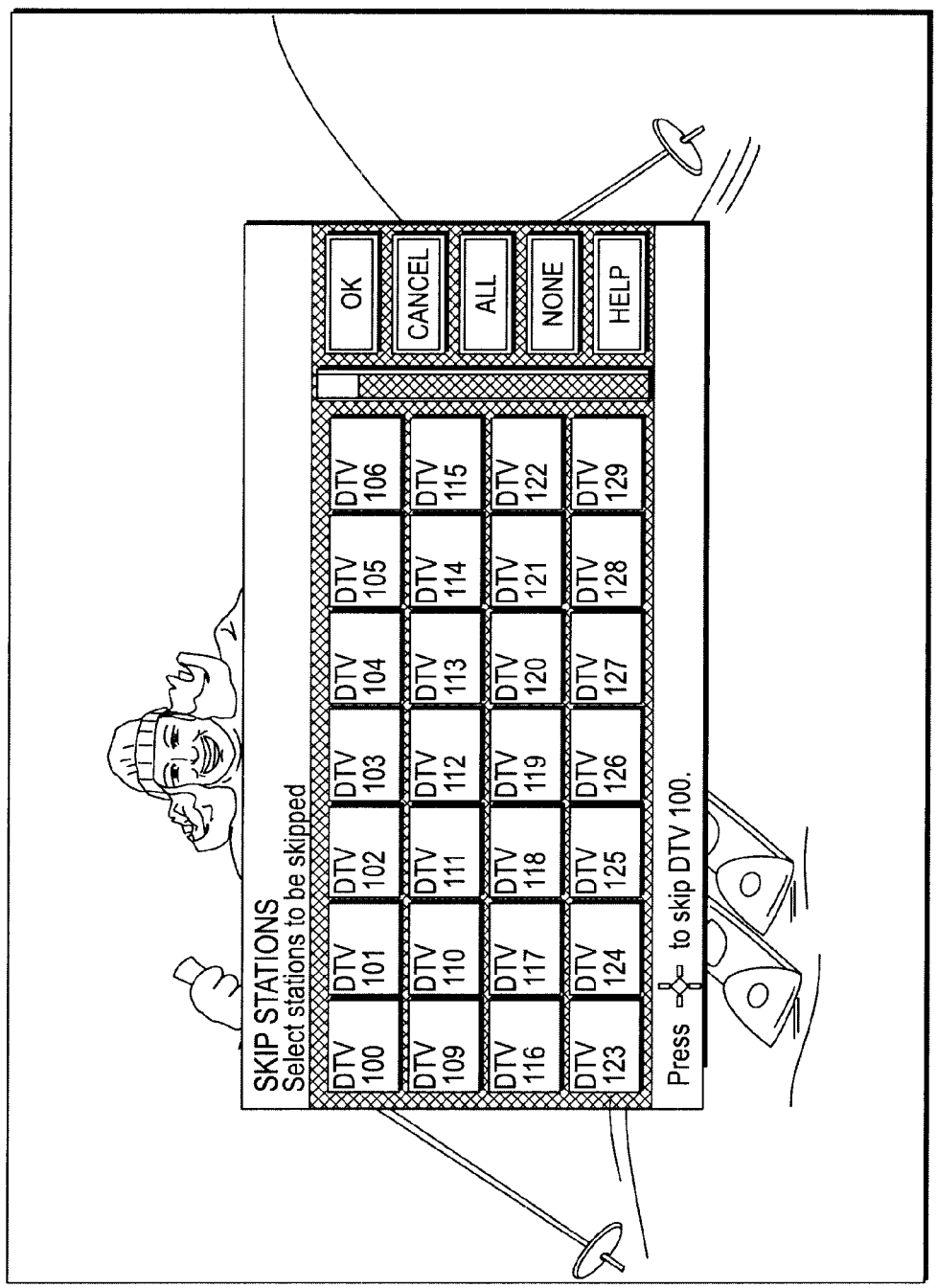

FIG. 12F is illustrative of the skip stations feature provided to the user. The user simply moves the system pointer to highlight a station, e.g., station 100, and depresses the selection button to select the station. Thereafter, when scanning or "channel surfing" stations, the selected station (s) are skipped. Furthermore, it is preferred that the station guide (FIG. 14A) does not show skipped stations. In addition, it is preferred that the system provide a custom guide in the format similar to the Master Guide of FIG. 8, except that channel and program information are only displayed for non-skipped channels. The custom guide is accessed through the "other guides" item in the main menu. The custom guide is shorter because skipped station information is not displayed and unused areas due to the stations skipped are removed from the guide. Furthermore, the custom guide provides information regarding only those channels the user is interested in.

Figure 13A:
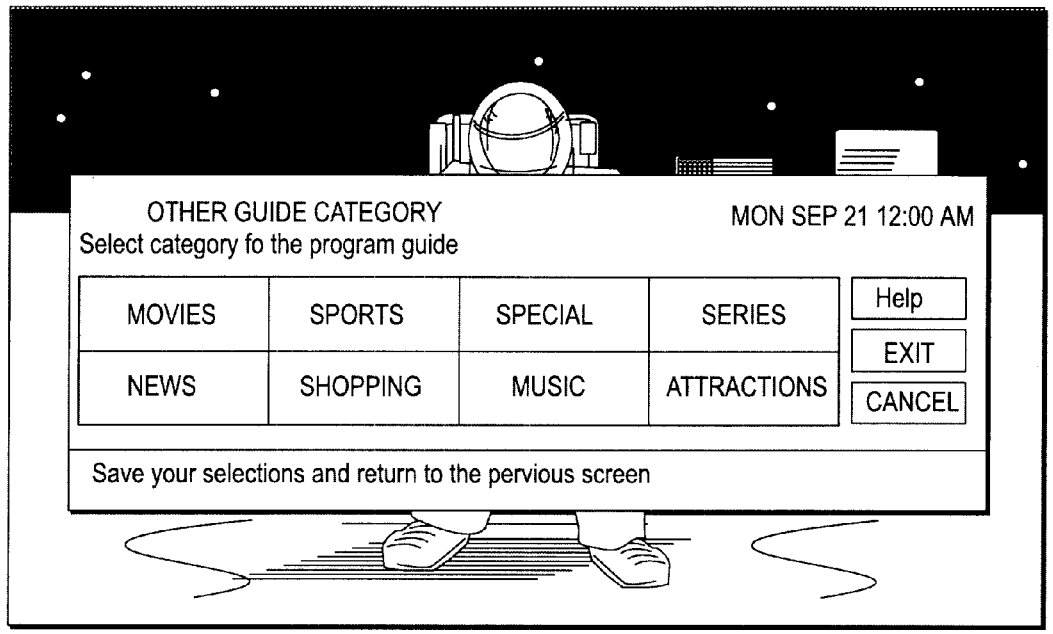
FIG. 13A is an illustrative display of a category selection guide in accordance with the teachings of the present invention.
Figure 13B:
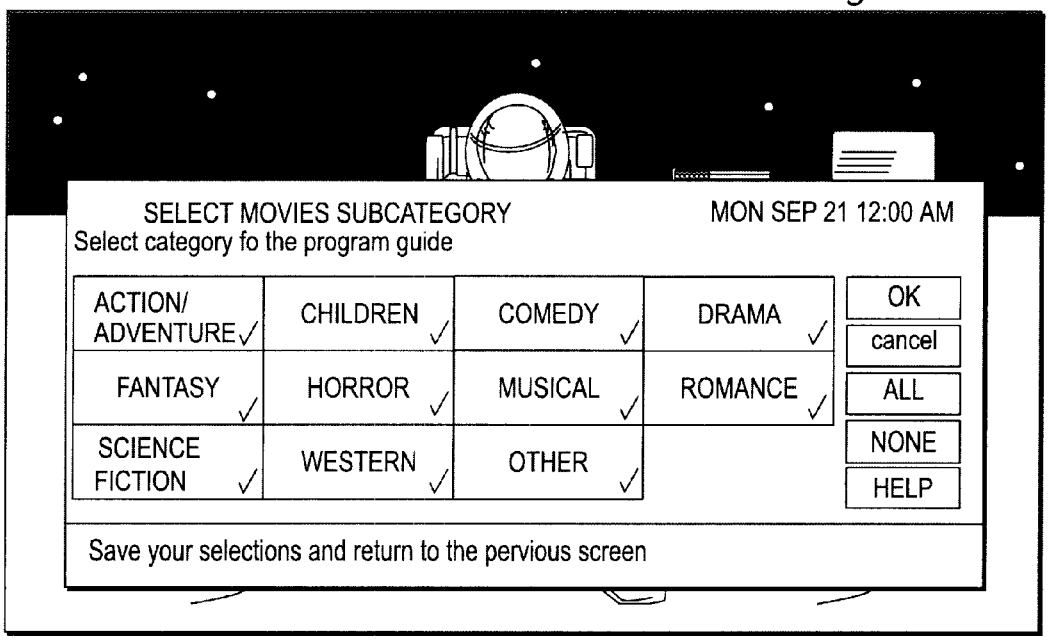
FIG. 13B is an illustrative display of a subcategory guide.

On the main menu an innovative feature referred to herein as "other guides" 1210, enables the user to select a particular category of programs to view on a guide. For example, a selection of the other guides, item 1210 on the main menu 1201, will bring up a display such as shown in FIG. 13A. FIG. 13A is an example of categories which may be distinguished. Referring to FIG. 13A, exemplary categories are movies, sports specials, series, news and shopping. Once a category is selected, a subcategory menu is displayed, an example of which is shown in FIG. 13B, which displays subcategories related to the selected category, movies. Selection of the "all" button 1305 selects all the subcategories. Otherwise, through manipulation of the pointer, certain categories can be selected. If the user selects certain categories as a preference, those programs that meet the category criteria are displayed more prominently than the remaining programs. The actual locations in the guide remain the same so as to provide the user program information regarding all stations; however by displaying the programs of the selected category/subcategory more prominently, the user can easily focus on the type of programming he prefers.

FIG. 13C illustrates utilization of the pointer to select categories and subcategories. Referring to FIG. 13C, at step 1355 the other guides display of the main category is shown. The sports category is pointed to as represented by the highlight. At step 1356, the pointer is moved using the left arrow to the movies category. At step 1357, the select button is entered to indicate that the movies category is selected. The system responds by displaying the subcategories for movies.

The user then has the opportunity to select all, in which all categories are highlighted as shown in the display of step 1357, or the user can select one or multiple subcategories as shown in display of step 1358 in which the Comedy Guide is shown. The down arrow key is then used to move to the Fantasy Guide, step 1359. The user then depresses the select button to show that the fantasy Guide has been selected, step 1360. The right arrow button then moves the display pointer to the OK button where the user can select again to indicate that his selection is complete, 1361. At this point a guide or list of programs meeting that criteria is displayed, step 1362. This display preferably includes all programming for the channels but highlights those that meet the selection criteria of the user. The advantage to this is that the user is provided the category of programs he selected but is still provided information regarding other programming. The guide then permits the user to move from the station to station that meet the selected categories, to enable the user to select the programming desired.

Figure 14A:
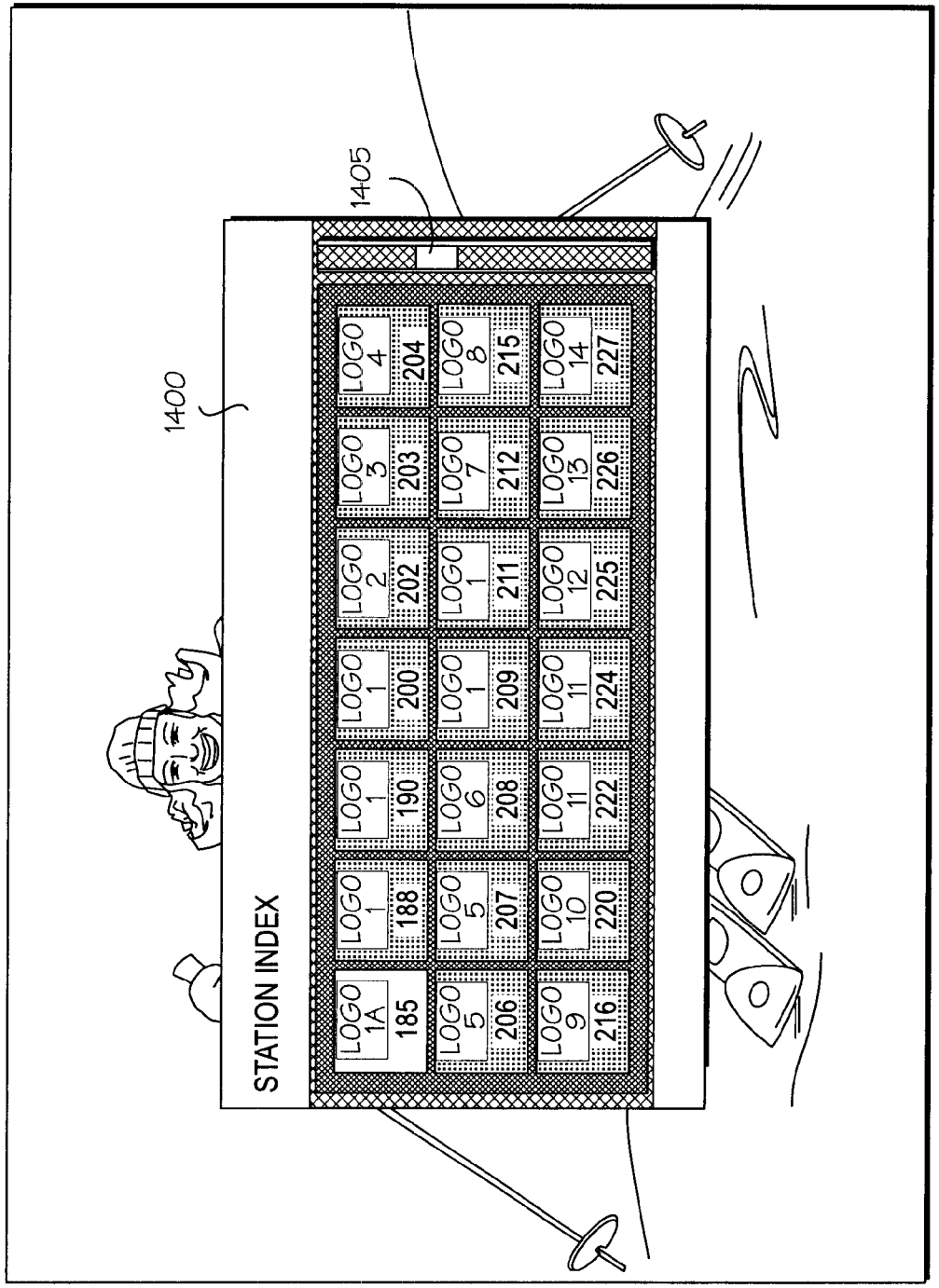
FIG. 14A is an illustrative display of a station index displayed in accordance with the teachings of the present invention.

Referring back to FIG. 10, if the select button is pressed, the system responds by providing the station index, step 30. An example of a station index is shown in FIG. 14A. The station index provides a simple but effective way to give the user the information regarding available stations and the ability to easily preview stations without specifically moving sequentially through each channel number. The icon provides a visual means by which the user can associate the station in order to determine which stations he wishes to preview and possibly select for viewing. Thus, using the station index 1400 and moving the system pointer, in the present illustration by using up, down, right, and left arrow keys to highlight a particular box surrounding a station icon, the user can preview the audio and video currently broadcasted to determine whether it is desirable to select that station and view When the user moves the system pointer to a box surrounding a different station logo and channel number than that currently tuned to and displayed on the screen, the system responds to the movement of the pointer by tuning to the channel, outputting the audio through the television speakers and displaying the video beneath the station guide such that user gets an idea of the current program on that channel. If the user wishes to exit the station index, the tuned signal that is currently displayed is removed and the system tunes back to the channel the system was tuned to at the time the station index was selected. Thus, the user can scan programs on a channel by channel basis and simply exit if the he finds nothing of interest to view. However, if the user finds a station he wishes to view, he simply depresses the select button (for example, the center button of the arrow keys of the remote) and the station index display is removed, thus leaving the display of the entire video of the broadcast (in addition to the audio which is always present even when the station index was displayed).

Figure 14B:
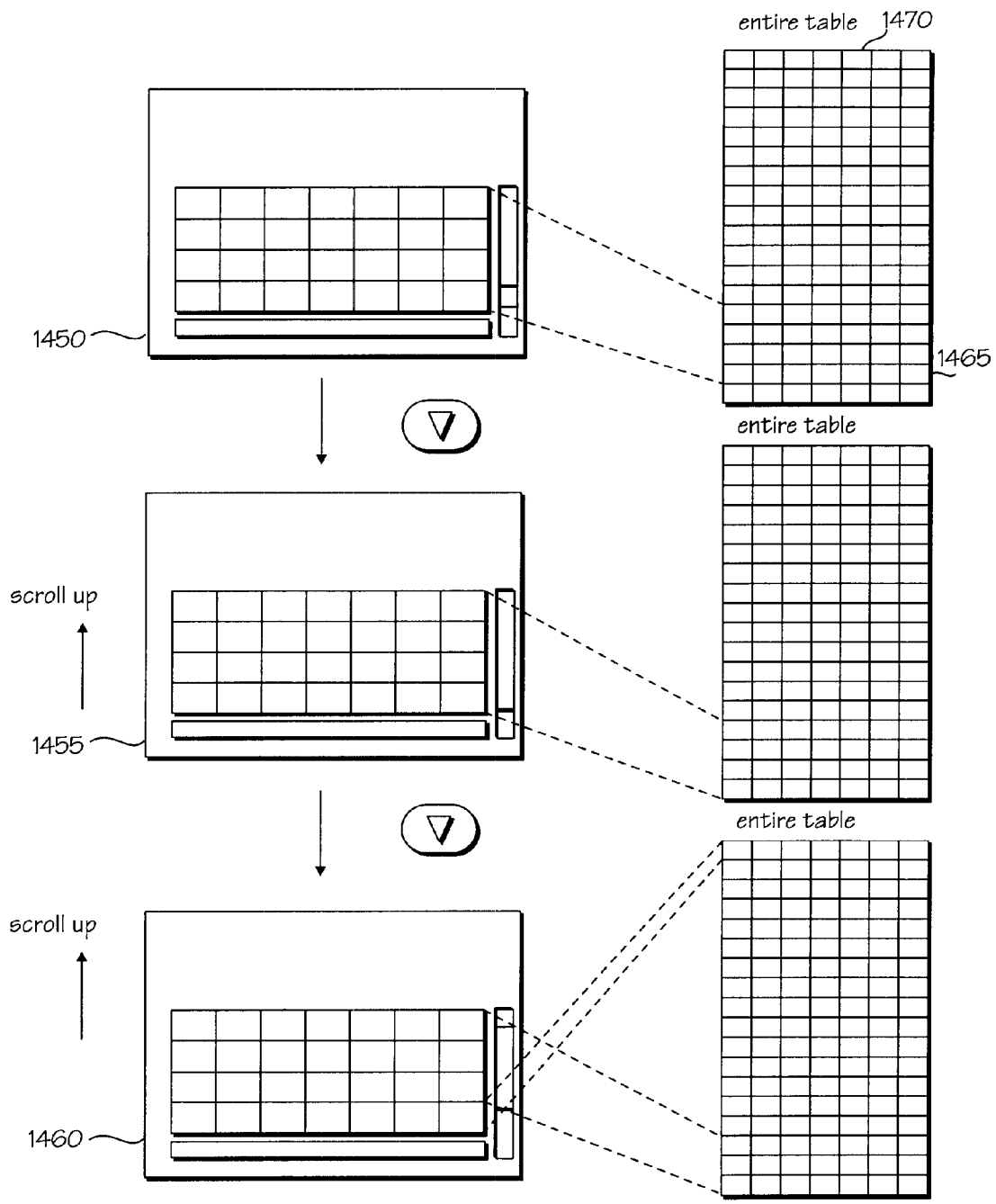
FIG. 14B is a descriptive flow diagram illustrating the use of the station index of FIG. 14A.

The number of stations which are selectable is so great that to display on one screen would be quite difficult. Therefore, in the system a table is generated in memory containing the station information such as the icon and channel number. The scroll bar 1405 is used to tell the user where in the table of stations the currently displayed stations are located. This gives the user perspective of where in the table of stations he is currently located. FIG. 14B illustrates the process of scrolling among the stations. At step 1450, the user has located a determined location 1465 in the table 1470. Selection of the down arrow key causes a scroll up function to occur, step 1455. Similarly, the depression again of the down arrow key, step 1460, causes another scroll up function to occur, in this case displaying the bottom three rows of stations and the top rows of stations as the table can be scrolled in a continuous manner.

Figure 14C:
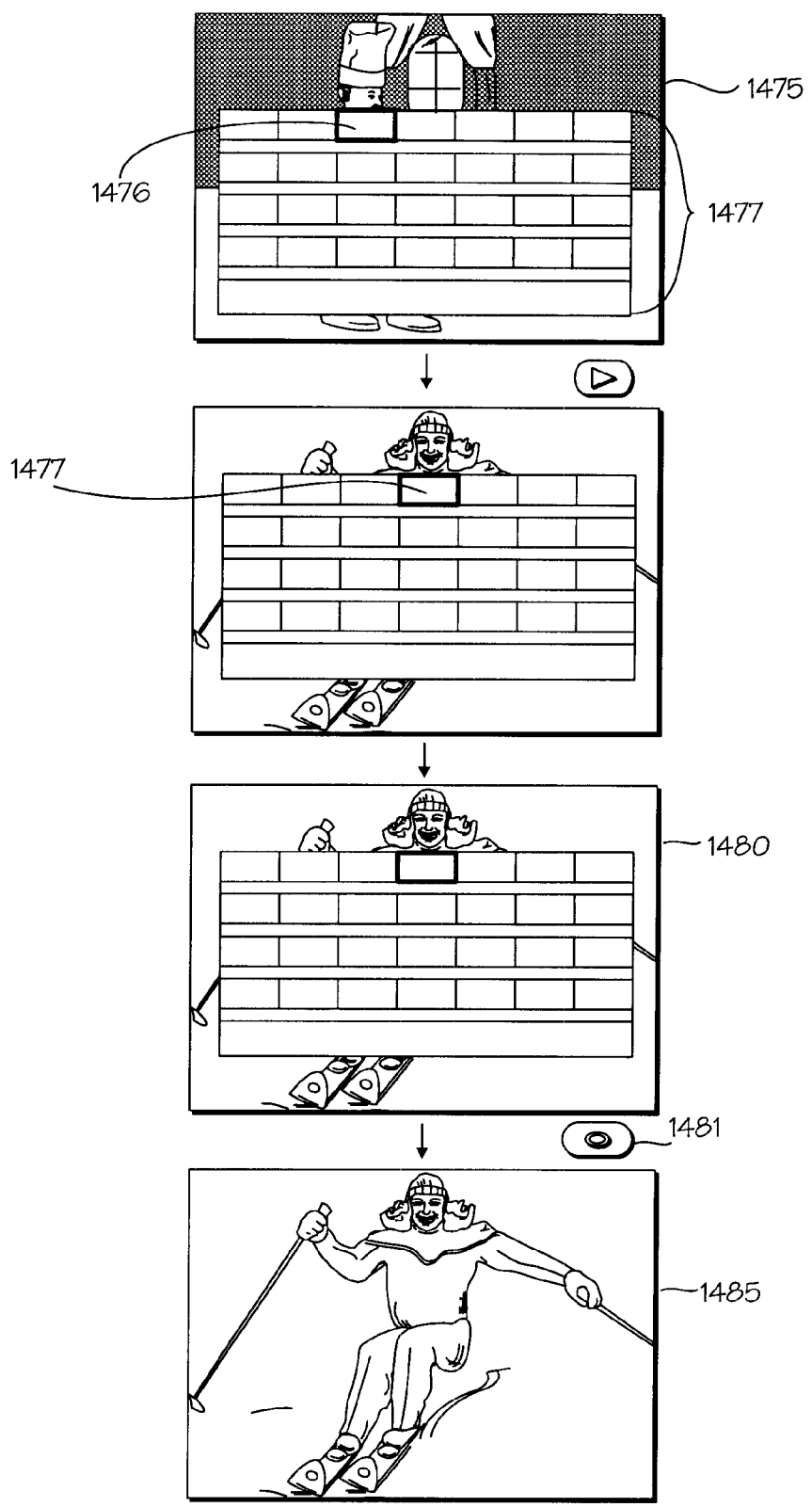
FIG. 14C illustrates the selection of a station using the station index.

FIG. 14C illustrates the selection of a station using the station index. At step 1475 the display includes the video and audio of the station the pointer is currently located at, station 1476, and the station index which is placed over the video 1477. In this example, the right arrow key is depressed which moves the pointer station to the station immediately to the right of the previous station 1476 to station 1477. The system responds by tuning the system to the station 1477 and displaying the audio and video for that station at step 1480. The user in this instance depresses the select button 1481 and the system responds at step 1485 by removing the station index and leaving the selected audio and video for the user to view. The capability to preview broadcasted stations before exiting the actual program selection menus or guides is also provided with respect to the electronic programming guide (EPG).

Figure 15:
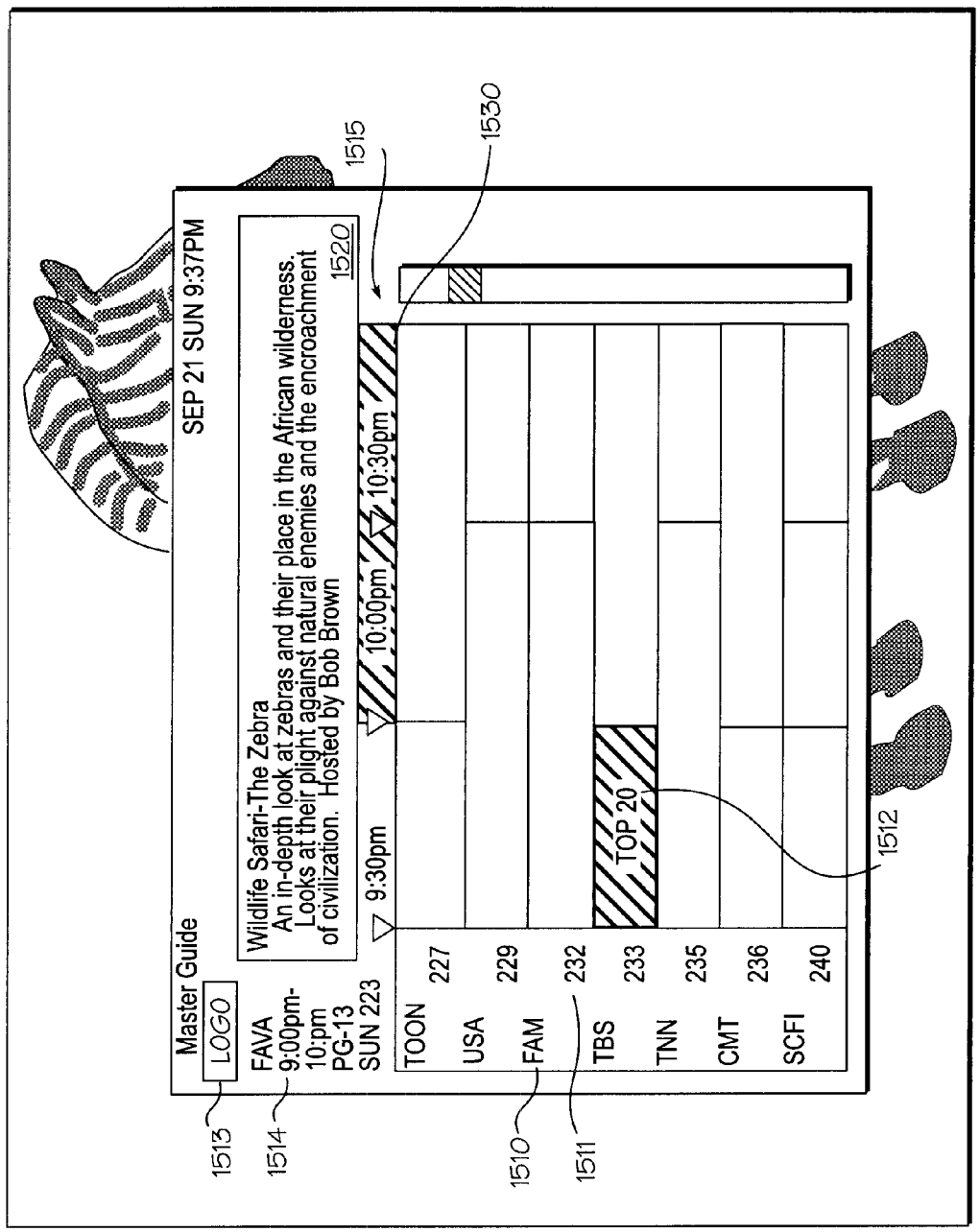
FIG. 15 is an example of an electronic programming guide in accordance with the teachings of the present invention.

Referring to FIG. 10, at step 1035 if the guide button is depressed, the electronic programming guide is entered. An example of the electronic programming guide is shown in FIG. 15. The electronic programming guide provides such information as the call signs for the stations 1510, the broadcast system station number 1511, the currently tuned station 1512, including the station logo 1513, and the time the currently tuned program is broadcasted 1514. The stations are arranged on an XY matrix according to broadcast station number 1511 and time of broadcast 1515.

For each period of time a particular program is broadcasted on a particular station there is typically provided a program title. However, prior art systems do not provide any further information regarding the program. In order for the user to preview the program the user has to select the program to view, thereby exiting the guide. In order to get further descriptive information regarding the program, the user is required to select an info button to enter into another level of menus to get the information regarding program description. However, in the present invention the system tunes to the station that the pointer is located at and provides the video and audio in the areas of the display not covered by the guide. Furthermore, the system retrieves program description and displays it in a special program name, block 1520, giving the user both a verbal description of the program and a preview of the actual broadcast of the program.

If the user wishes to move the pointer to a different station, the system, again, automatically tunes to the station the pointer is located at, providing the audio and video in the background and further retrieves the program information to provide the description of the program currently broadcasted. The user can preview many different stations without entering and exiting the guide repeatedly.

The present embodiment further provides the capability to relay reserved program information to the user. For example, this may be utilized if the user prepays for a pay-per-view program. That time is considered reserved as it is paid for by the user. Furthermore, the user is able to view on the display prior reserved programs. In the present embodiment, the programming time bar 1515 of the electronic programming guide is highlighted or shaded at the times during which there is reserved programming to produce a reserve time bar 1530. The reserve time bar 1530 functions as a reminder to the user that he has reserved time to view a pay-per-view program thus eliminating duplicate purchases or minimizing forgetfulness of reserved programming.

Referring back to FIG. 10, an innovative way for a user to view favorite stations in the same guides that enables a user to view programming on other stations is provided. When the user is in a certain index or guide and depresses the favorite button on the controller device, the index or guide is modified to display at the beginning of the index or guide the favorite stations as selected by the user. For example, referring to FIG. 10, at step 1045, if the favorite button is pressed, the station index is modified to display the favorite stations at the beginning of the station index. Similarly, at step 1055, when the favorite button is depressed, the display of the guide is modified to show the programming of the favorite stations at the beginning of the guide, step 1060.

Figure 16A:
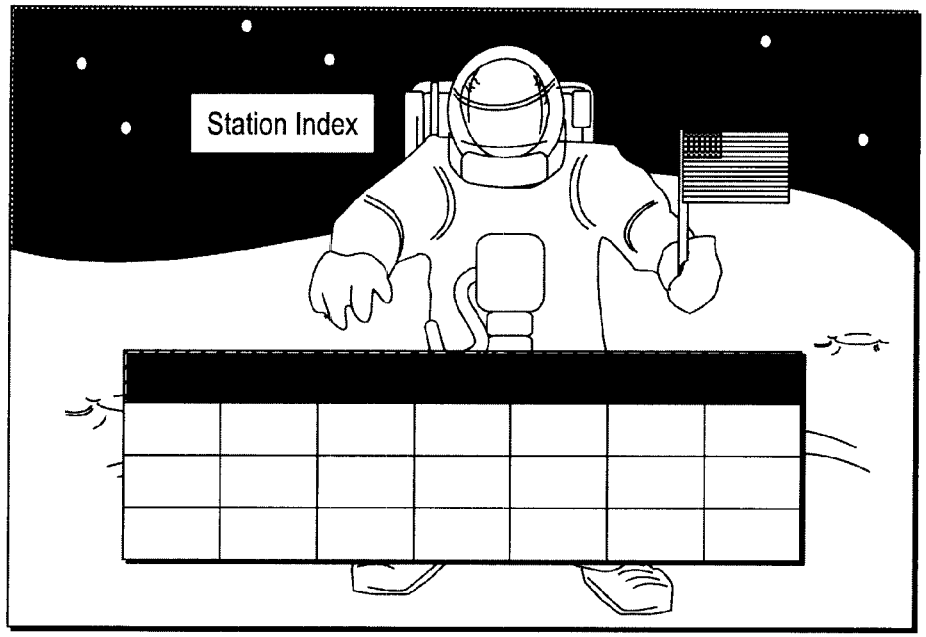
FIG. 16A, FIG. 16B and FIG. 16C illustrate the use of a user's favorite stations function in accordance with the teachings of the present invention.
Figure 16B:
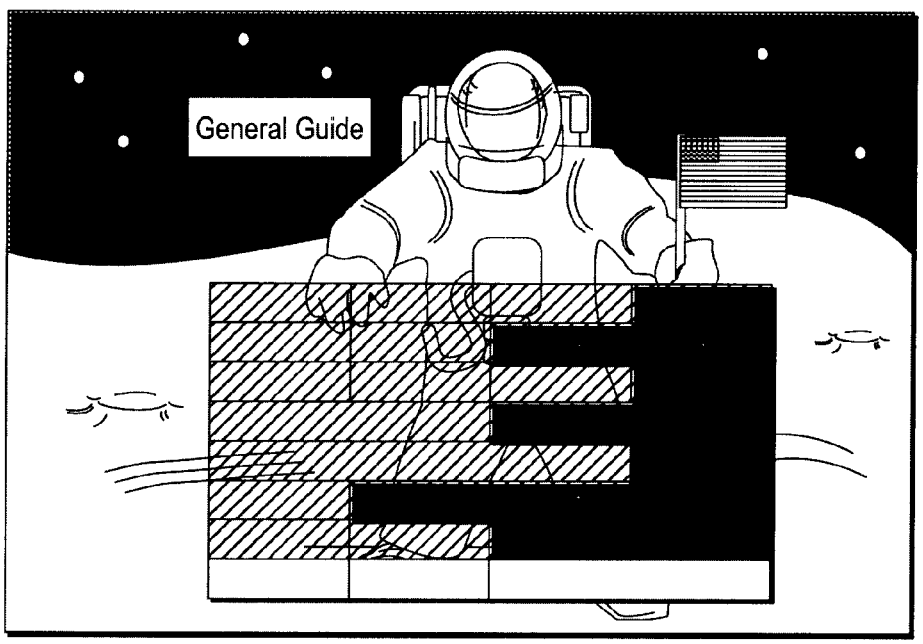
Figure 16C:
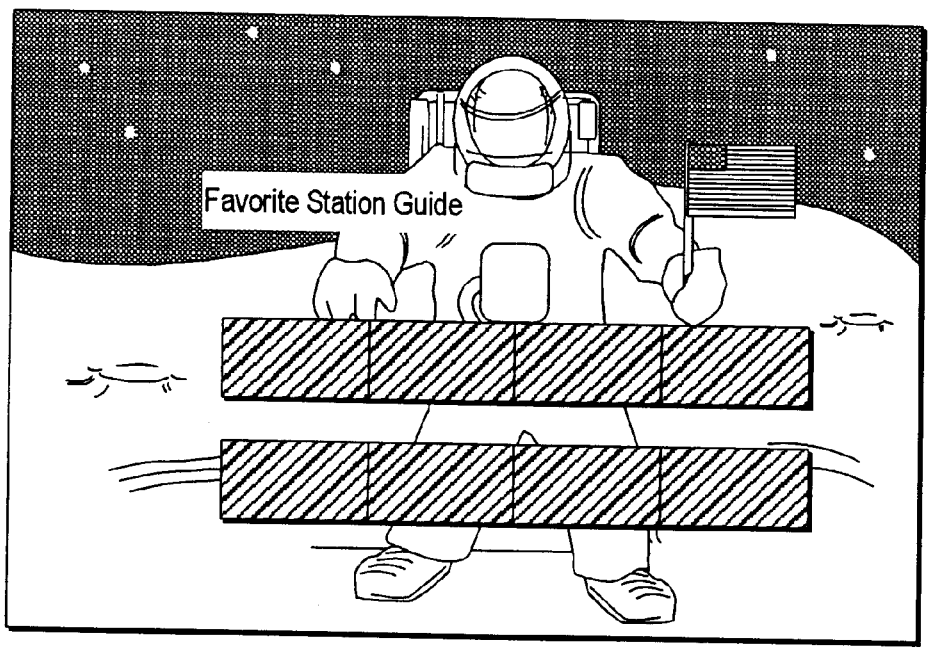

FIG. 16A, for example, is illustrative of the station index and the display of the favorite stations on the top row of the station index. Similarly, FIG. 16B shows the general guide and the top seven rows of the general guide display the top seven stations as indicated by the favorite stations. The system preferably provides for a multiple user's favorite stations. For example, in the present illustration, three users can designate their favorite stations or one user may have three separate sets of favorite stations. In the present embodiment, the favorite stations can be switched from one user's set of favorite stations to another user's set of favorite stations by successive depression of the favorite button on the remote controller. It is readily apparent that other methods can also be used. FIG. 16C is a block diagram illustration of still another display of favorite stations referred to as the favorite station guide. This is entered through the main menu and will now be described in detail with reference to FIG. 17.

Figure 17:
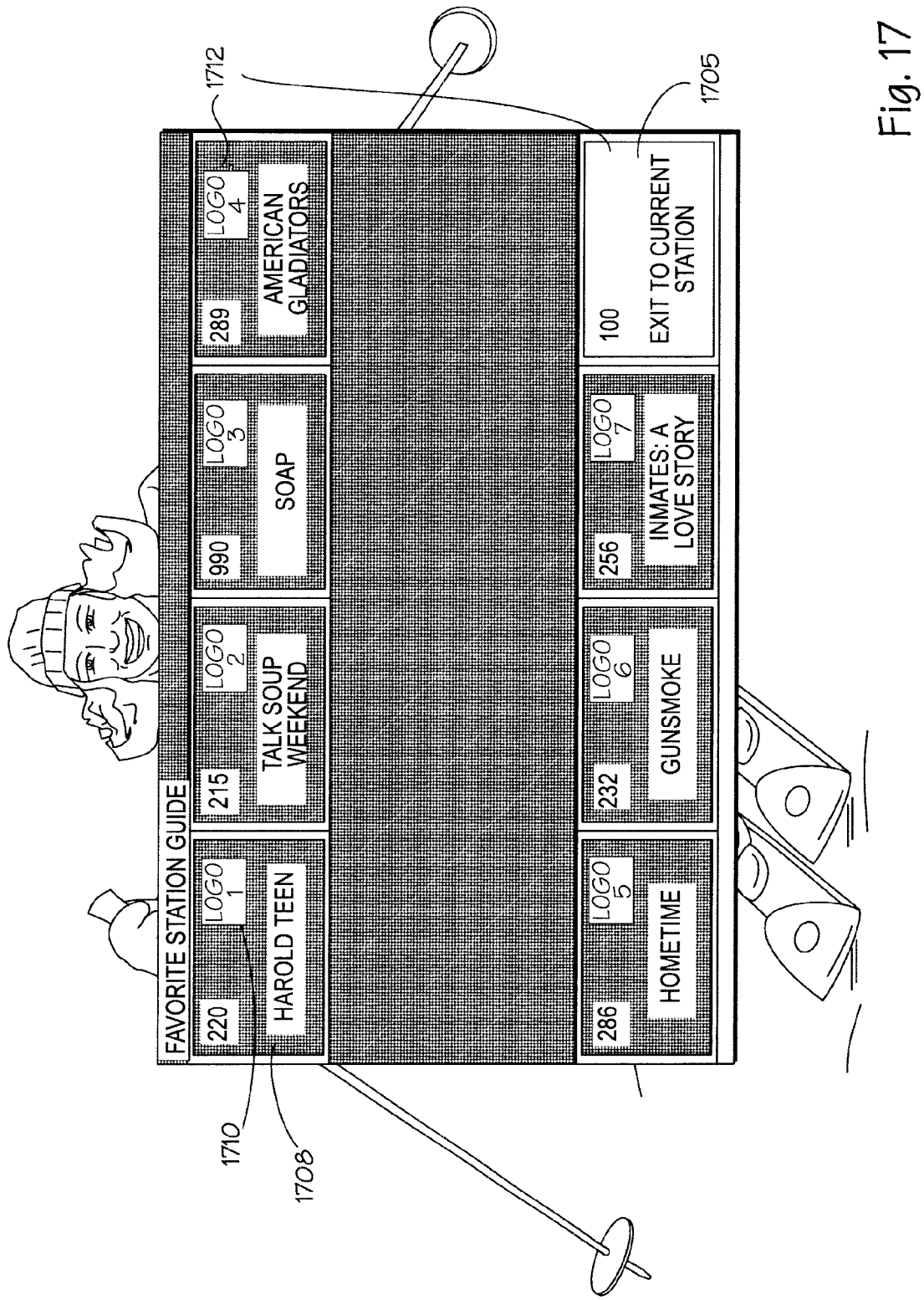
FIG. 17 is an illustration of the favorite station guide in accordance with the teachings of the present invention.

Referring to FIG. 17, included in the favorite station guide is a wealth of information that enables the user to determine at this display information regarding the programs currently broadcast on the favorite stations. The favorite station guide is entered in through the main menu. When selected, the favorite station guide will show in the background the currently tuned station and the audio of the currently tuned station. When entering the guide, the exit to current station box 1705 is displayed as highlighted, enabling the user to immediately return by the program he was viewing at the time he entered the guide. Thus, the user has access to seven favorite stations. Each box includes the channel logo and channel number 1708, 1710, and the programming currently broadcasted on those stations 1712.

The user can use the system pointer to move among the favorite stations. The system in response to the movement of the pointer will tune the system to the station the pointer is currently located at. If the user finds a channel he wishes to view after previewing using the favorite station guide, the user simply selects the station, automatically exiting the station guide, and the system responds by removing the display of his favorite station guide leaving the entire tuned video image. If the user does not wish to view any of the programs listed in the favorite station guide, the pointer is moved to the previous box and selected. The system responds by exiting the favorite station guide and also automatically tuning back to the station the system was tuned to prior to entering the guide. Thus, the user can easily scan programming on his favorite stations and either select one of these to view or go back to the station he was viewing at the time the guide was entered.

Figure 18A:
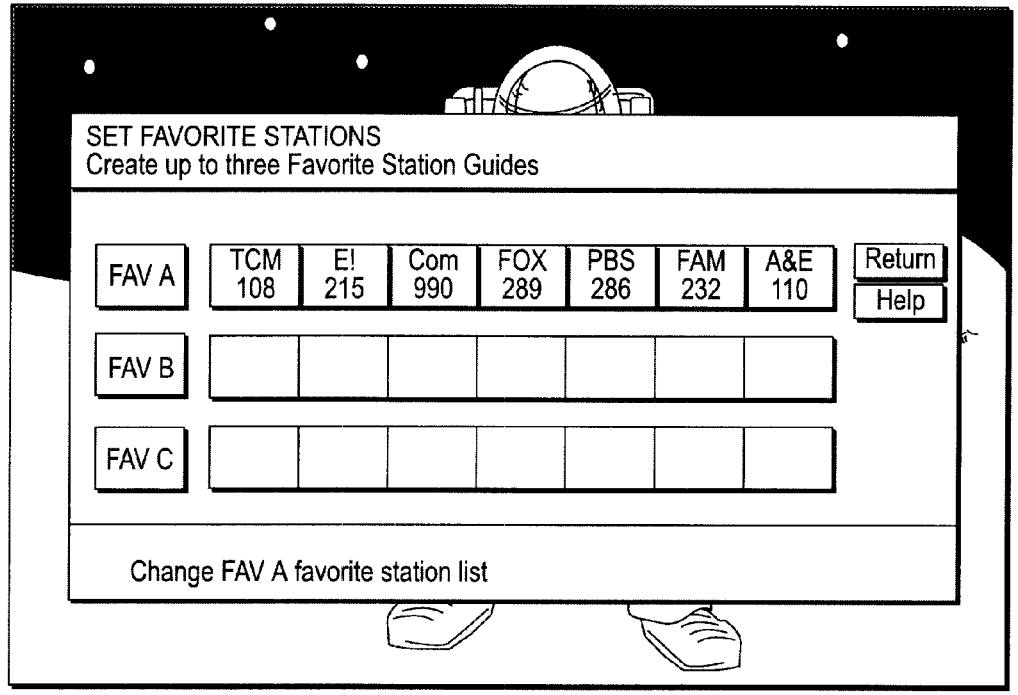
FIGS. 18A and 18B illustrate the menus for setting up the user favorite stations.
Figure 18B:
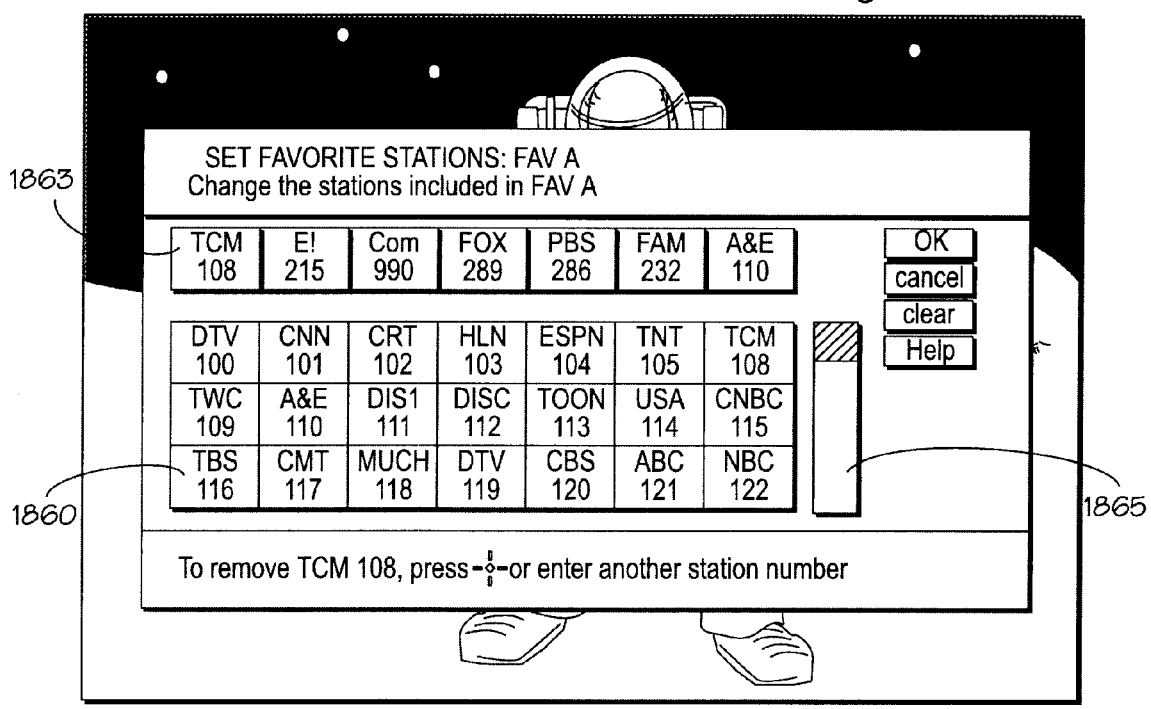

FIGS. 18A and 18B illustrate the menus for setting up the user favorite stations. This is entered into through the custom setup menu. Once this is selected, the display, an example of which is shown in FIG. 18A, is generated. The user can then modify or setup stations to be included in his favorite stations. The favorite stations currently programmed in will be displayed for each user on this menu. The user can then select a particular user set of favorite stations and the set favorite station menu, an example of which is shown in FIG. 18B, will be displayed.

Referring to FIG. 18B, The upper portion of the menu 1850 displays the current settings of favorite stations. The lower part 1860 shows all possible stations which the user can select to update the current favorite station list. The scroll bar indicates to the user where in the table of stations the currently displayed stations are located 1865. The user has two methods to update favorite stations. The box highlighted in the favorite stations is currently selected 1850 and identifies the box that can be modified at this point. The user can then change the station noted in that favorite station box by entering in the channel number directly using the numeric key pad on the remote control, or by moving the pointer to the station shown on the display 1860. For example, by entering in the down arrow key the user will move from the box 1863 down to the grouping 1860 where selection of a replacement favorite station can be performed. When a select button is depressed the station currently noted by the pointer will replace the favorite station 1863. This method provides a graphic presentation for users to easily identify stations by their logos to select favorite stations to utilize in the selection of programs to view.

In today's broadcast systems additional information such as categories of program, for example sports, movies and comedy, are provided with the transmissions of the actual broadcast. The term "channel surfing" is quite well known. When channel surfing, a viewer or user is simply using his channel "+" or "−" keys to move or surf sequentially from channel to channel in ascending numeric order or descending numeric order. In the present invention, however, this technique of channel surfing is somewhat modified. This is explained with reference to the flowchart of FIG. 19.

Figure 19:
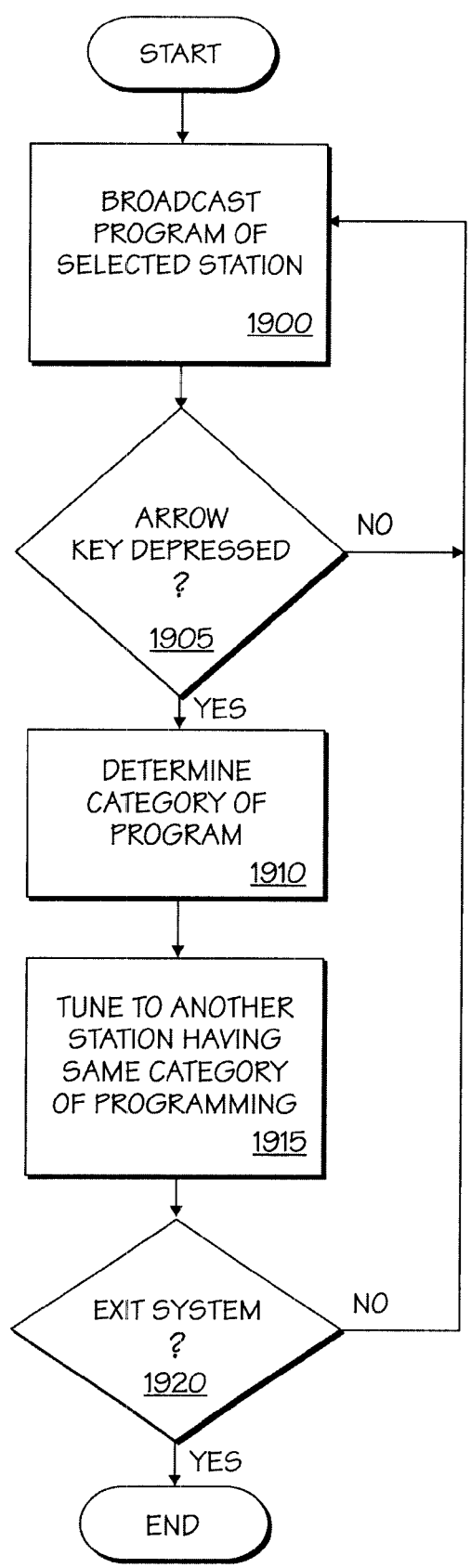
FIG. 19 is a flow diagram illustrating the process of moving among channels having the same programming category in accordance with the teachings of the present invention.

Referring to FIG. 19, at step 1900, the system is currently tuned to a station broadcasting the current programming. This may be, for example, a sports program. The user may want to see what other sports programs are provided. Certain buttons on the remote may then be responsive to the user's desire to see other sports programs. These other programs may be selected through the guides and menus described previously; however, in the present embodiment, the user can utilize the pointer keys used for electronic guide keys, e.g., the pointer direction keys, to indicate to the system that the user wishes to simply channel surf among all sports programs in accordance with the direction indicated by the button depressed. Thus, if one of the arrow keys is depressed at step 1905 the system will take the determined category of the programming, step 1910, and then use the category indication to find another station having the same category of programming, step 1915, and tune to that station. The user can repeatedly perform this process until he finds a station that he wishes to view, enters in a menu or guide, or exits the system, step 1920. Thus, the guide arrow keys which are not used when the guide is not displayed on the screen, as opposed to the channel arrow keys, may provide a dual function for those viewers who wish to simply move from station to station having a certain type of programming.

Other variations are also contemplated. For example, if the control device includes 4 direction keys, right, left, up, down, the system responds to the up and down keys to perform sequential channel to channel tuning. The user uses the right and left direction keys to perform category channel to channel tuning. Additional functionality includes utilizing the electronic programming guide select key on the control device to display information regarding the currently tuned channel. This information may simply be a channel banner superimposed over the broadcast containing such information as the title of the program, start and end times, and program description. Multiple displays containing additional information may be generated and displayed by repetitive depression of the select key. The user, in this embodiment, is able to tune to channels and gather basic information regarding the channel and current programming on the channel without the use of the electronic programming guide.

The invention has been described in conjunction with the preferred embodiment. It is evident that numerous alternatives, modifications, variations, and uses will be apparent to those skilled in the art in light of the foregoing description.

What is claimed is:

1. In a multiple channel broadcasting system in which programs are broadcasted for display on a screen, a method for generating an on-screen favorite station guide for a user to select favorite channels to view, comprising the steps of:

selecting at least one channel as the user's favorite channel;

tuning to a first channel to provide a broadcast of a first program on the screen;

generating a favorite station guide, said favorite station guide consisting of an array of favorite stations, each array element providing a selectable area identifying the channel number, station identification and title of currently broadcasted program of each favorite station;

superimposing the favorite station guide over the broadcast on the screen, such that only a portion of the video of the broadcast is covered by the displayed favorite station guide and the audio is broadcasted;

moving a system pointer displayed on the screen to point to a selectable location on the displayed station guide to point to a second program currently broadcasted on a favorite station on a second channel; and tuning to the second channel to provide a broadcast of the second program on the screen in response to the movement of the pointer.

2. The method as set forth in claim 1, wherein the favorite station guide includes a selectable area designated as an exit from the menu function, said method further comprising the step of:

said user moving the pointer on the screen to point to the selectable location corresponding to the exit form the menu function;

said system responding to the movement of the pointer to the selectable location corresponding to the exit from the menu function by tuning the system to broadcast the first channel and removing the favorite station guide from the screen.

3. The method as set forth in claim 1, further comprising the steps of:

said user indicating selection of the second channel; and said system responding to the selection of the second channel by removing the favorite station guide from the screen.

4. The method as set forth in claim 1, further comprising the steps of:

providing a favorite station selection menu of available channels which is displayed on the screen, said menu having a plurality of selectable areas, each selectable area corresponding to one available channel; and said user moving the pointer over corresponding selectable areas of the screen to select available channels as favorite stations, said selected channels displayed in subsequent displays of the favorite station guide.

5. A multiple channel broadcasting system in which programs are broadcasted for display on a screen comprising, a favorite station guide, said favorite station guide consisting of an array of favorite stations, each array element providing a selectable area identifying the channel number, station identification and title of currently broadcasted program of each favorite station, said favorite station guide superimposed over a broadcast of a first program on a first channel on the screen, such that only a portion of the video of the broadcast is covered by the displayed favorite station guide and the audio is broadcasted;

a pointer control device manipulated by a user, said pointer control device moving a system pointer displayed on the screen to point to a selectable location on the displayed station guide to point to a second program currently broadcasted on a favorite station on a second channel: and said system responding to the movement of the pointer to the selectable location by tuning the second channel to provide a broadcast of a second program on the screen.

6. The system as set forth in claim 5, wherein;

the favorite station guide further includes a selectable area designated as an exit from the menu function; and said system responding to the movement of the pointer to the selectable location corresponding to the exit from the menu function by tuning the system to broadcast the first channel and removing the favorite station guide from the screen.

7. The system as set forth in claim 5, further comprising:

means for said user indicating selection of the second channel; and said system responding to the selection of the second channel by removing the favorite station guide from the screen.

8. The system as set forth in claim 5 further comprising:

a favorite channel menu that displays on a single screen a list of any currently selected favorite channels and a list of available channels, each currently selected favorite channel and available channel having a corresponding selectable area on the display; and said user using the pointer, adding or modifying favorite channels by selection from the list of available channels.

\* \* \* \* \*